(12) United States Patent
Saketi et al.

(10) Patent No.: US 10,714,363 B2
(45) Date of Patent: Jul. 14, 2020

(54) PICKING UP AND PLACING OF MICRO LIGHT EMITTING DIODES USING POLYGON TOOL

(71) Applicant: Facebook Technologies, LLC, Menlo Park, CA (US)

(72) Inventors: Pooya Saketi, Cork (IE); Patrick Joseph Hughes, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 675 days.

(21) Appl. No.: 15/371,039

(22) Filed: Dec. 6, 2016

(65) Prior Publication Data

US 2018/0158704 A1   Jun. 7, 2018

(51) Int. Cl.
*H01L 21/67* (2006.01)
*H01L 33/62* (2010.01)
*H01L 25/075* (2006.01)

(52) U.S. Cl.
CPC ........ *H01L 21/67144* (2013.01); *H01L 33/62* (2013.01); *H01L 25/0753* (2013.01); *H01L 2933/0066* (2013.01); *Y10T 29/5313* (2015.01)

(58) Field of Classification Search
CPC ............... H01L 21/67144; H01L 33/62; H01L 2933/0066; H01L 25/0753; Y10T 29/5313; Y10T 29/53174; Y10T 29/53178; Y10T 29/53217; Y10T 29/53
USPC ......... 29/729, 739, 740, 742, 749, 700, 832, 29/829, 825, 592.1
See application file for complete search history.

(56) References Cited

U.S. PATENT DOCUMENTS

2003/0102681 A1* 6/2003 Bouchard .......... H05K 13/0409
                                                           294/188

OTHER PUBLICATIONS

Kenis, C. et al., Fabrication of Ceramic Microscale Structures, *J. Am. Ceram. Soc.*, 2007, pp. 2779-2783, vol. 90, No. 9.
Zimmermann, S. et al., "Automated Robotic Manipulation of Individual Colloidal Particles Using Vision-Based Control," *IEE/ASME Transactions on Mechatronics*, Oct. 2015, pp. 2031-2038, vol. 20, No. 5.

* cited by examiner

*Primary Examiner* — Peter Dungba Vo
*Assistant Examiner* — Azm A Parvez
(74) *Attorney, Agent, or Firm* — Fenwick & West LLP

(57) ABSTRACT

Embodiments relate to placing of semiconductor devices on a target substrate using a pick and place head (PPH) having a cross-section of a polygon shape and pick-up surfaces. The pick-up surfaces of the PPH are aligned with a carrier substrate mounted with the semiconductor devices, which may be light emitting diodes (LEDs). The PPH is moved toward one or more first semiconductor devices on the carrier substrate to pick up the one or more first semiconductor devices with a first pick-up surface of the PPH. The PPH is rotated to pick up one or more semiconductor devices dies with a second pick-up surface of the PPH. The one or more first semiconductor devices attached to the first pick-up surface and the one or more second semiconductor devices attached to the second pick-up surface are placed on a target substrate.

12 Claims, 21 Drawing Sheets

400

```
┌─────────────────────────────────────────────────────────────┐
│        Align a pick and place head (PPH) with a carrier substrate │
│                              410                            │
└─────────────────────────────────────────────────────────────┘
                              │
                              ▼
┌─────────────────────────────────────────────────────────────┐
│  Move the PPH toward one or more first LED dies on the carrier substrate │
│  to pick up the one or more first LED dies with a first pick-up surface of │
│                            the PPH                          │
│                              420                            │
└─────────────────────────────────────────────────────────────┘
                              │
                              ▼
┌─────────────────────────────────────────────────────────────┐
│   Receive contact signal from polymeric piezoelectric layer of the PPH │
│     indicating the PPH has picked up the one or more first LED dies │
│                              430                            │
└─────────────────────────────────────────────────────────────┘
                              │
                              ▼
┌─────────────────────────────────────────────────────────────┐
│  Rotate the PPH to pick up one or more second LED dies with a second │
│                  pick-up surface of the PPH                 │
│                              440                            │
└─────────────────────────────────────────────────────────────┘
                              │
                              ▼
┌─────────────────────────────────────────────────────────────┐
│  Receive contact signal from the polymeric piezoelectric layer of the PPH │
│   indicating the PPH has picked up the one or more second LED dies │
│                              450                            │
└─────────────────────────────────────────────────────────────┘
                              │
                              ▼
                    ╱ PPH populated? 460 ╲ ──── NO ────┐
                    ╲                    ╱             │
                              │                        │
                             YES                       │ (loop back to 440)
                              ▼
┌─────────────────────────────────────────────────────────────┐
│          Move the PPH away from the carrier substrate       │
│                              470                            │
└─────────────────────────────────────────────────────────────┘
```

Fig. 4

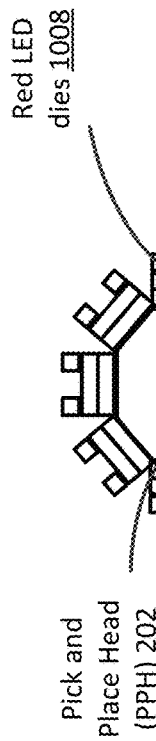

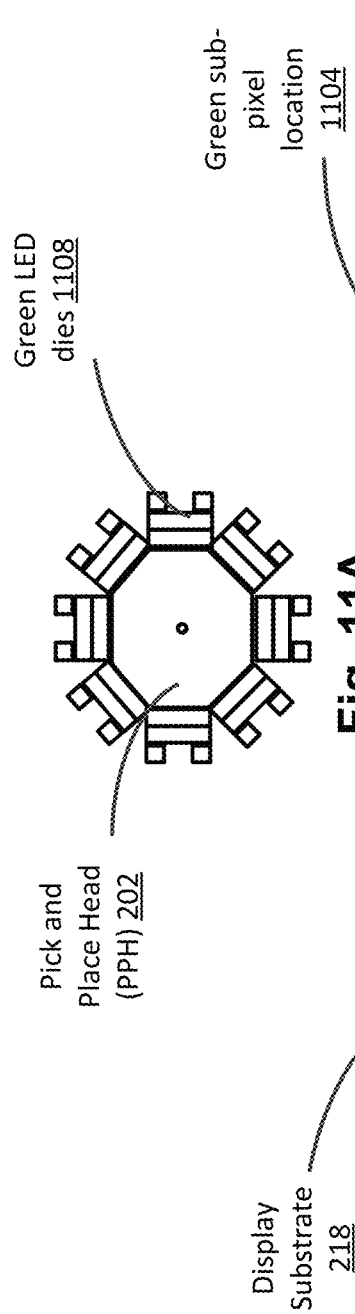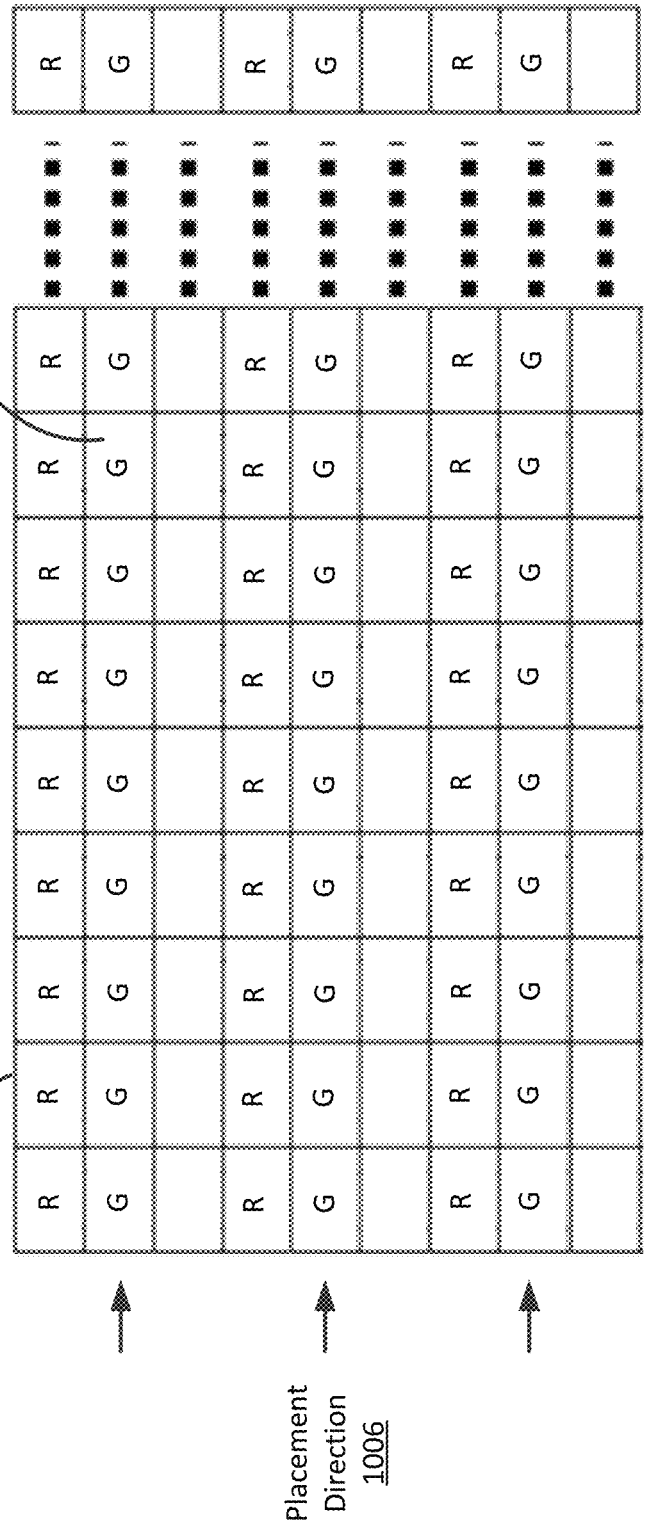

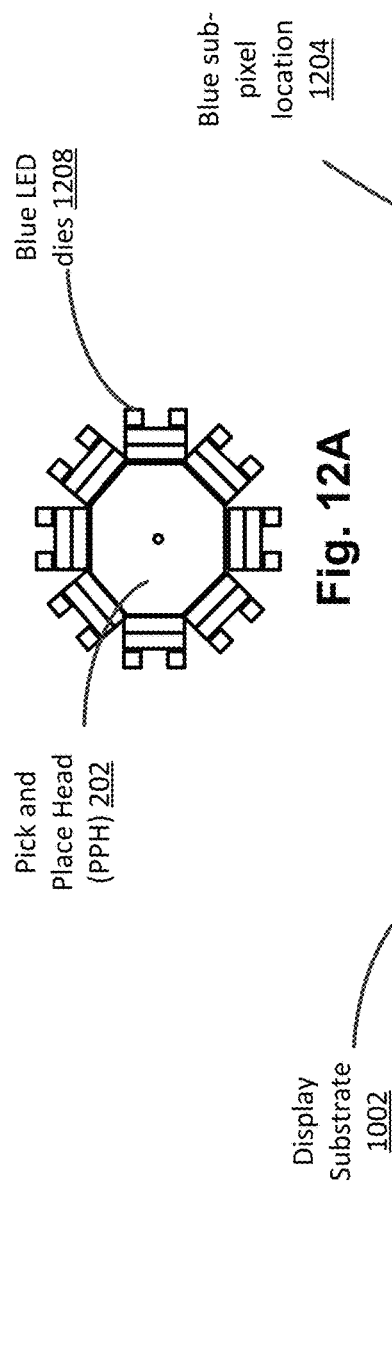

1400

Pick up a first array of first color LED dies with a first pick-up surface of a pick and place head (PPPH)
1410

Pick up a second array of second color LED dies with a second pick-up surfaces of the PPPH
1420

Pick up a third array of third color LED dies with a third pick-up surface of the PPPH
1430

Place, by rotating the PPPH, the first array of first color LEDs at first color sub-pixel locations of a display substrate, the second array of second color LEDs at second color sub-pixel locations of the display substrate, and the third array of third color LEDs at third color sub-pixel locations of the display substrate
1440

Fig. 14

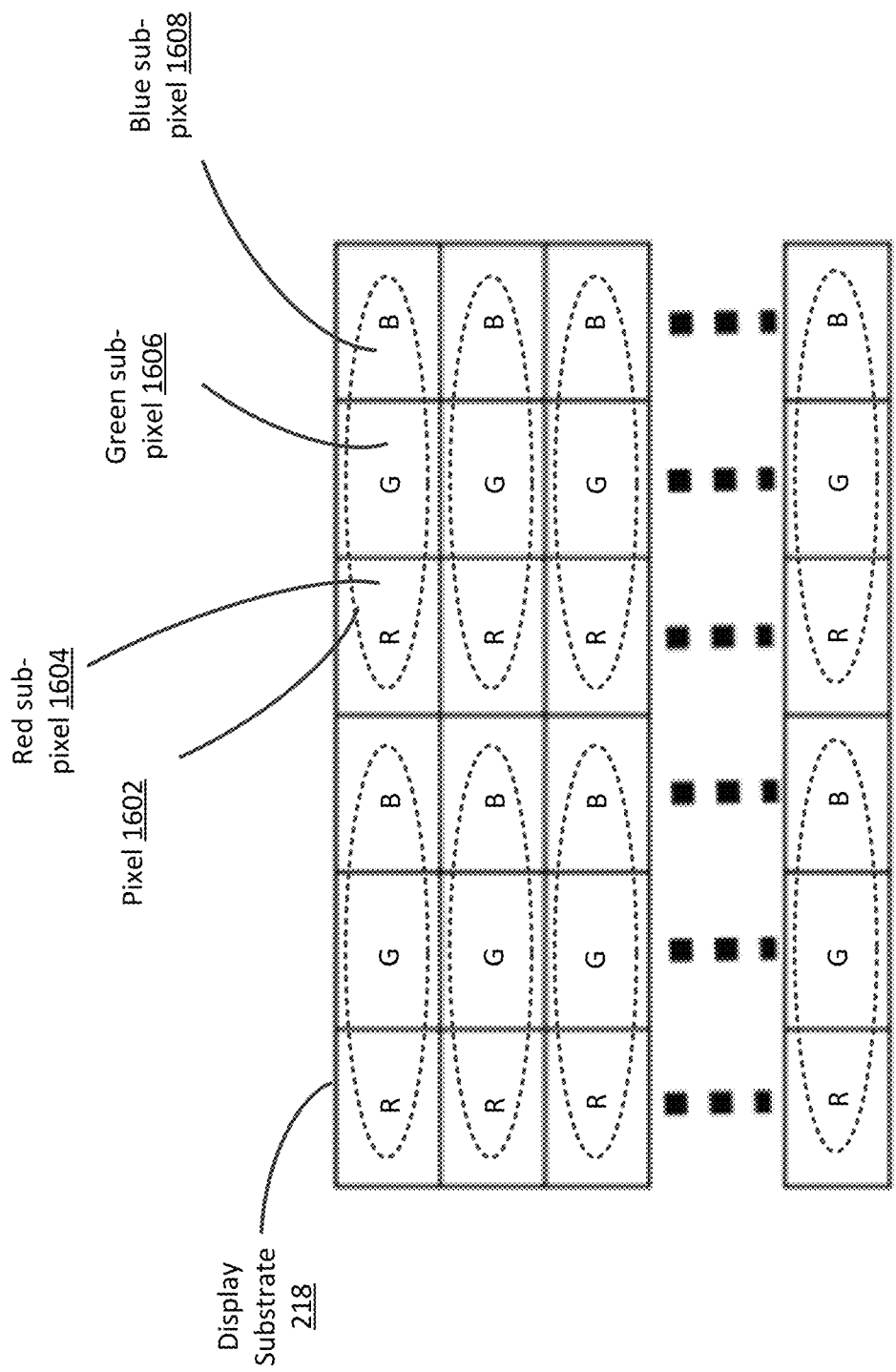

PICKING UP AND PLACING OF MICRO LIGHT EMITTING DIODES USING POLYGON TOOL

BACKGROUND

Displays are ubiquitous and are a core component of many wearable electronic devices, smart phones, tablets, laptops, desktops, TVs and display systems. Some example display technologies include Inorganic Light Emitting Diode (ILED) displays and Organic Light Emitting Diode (OLED) displays. In most portable devices (e.g., battery powered devices), the display uses a significant portion of the available battery power to produce the desirable brightness. To extend battery life and improve brightness levels, it is may be desirable to reduce power consumption and produce higher luminance emission from the light source. Large displays can be manufactured by placing standard LEDs (e.g., red, green, and blue ILEDs) at each pixel using standard manufacturing techniques. These techniques fail to scale effectively when applied to assembling small displays having small pixel sizes, such as displays used in smart phones or other mobile devices.

SUMMARY

Embodiments relate to placing semiconductor devices on a target substrate using a pick and place head (PPH) having a cross-section of a polygon shape and pick-up surfaces. The pick-up surfaces of the PPH are aligned with a carrier substrate mounted with the semiconductor devices. The PPH is moved toward one or more first semiconductor devices on the carrier substrate to pick up the one or more first semiconductor devices with a first pick-up surface of the PPH. The PPH is rotated to pick up one or more second semiconductor devices with a second pick-up surface of the PPH. The one or more first LED dies attached to the first pick-up surface and the one or more second semiconductor devices attached to the second pick-up surface are placed on a target substrate. Via rotation of the PPH, multiple pick-up surfaces may be populated with semiconductor devise for subsequent placement. In some embodiments, the target substrate may be a display substrate, and the semiconductor devices may be light emitting diode (LED) dies, such as µLED dies.

Embodiments also relate to a system for manufacturing a device. The system may include a carrier stage to hold a semiconductor device carrier, a substrate stage to hold a target substrate. The system may further include a pick and place head (PPH) having a cross-section of a polygon shape and pick-up surfaces, each pick-up surface configured to mount or release one or more semiconductor devices, a micromanipulator connected to the PPH to rotate or move the PPH, and a controller. The controller is configured to control the micromanipulator to cause the PPH to rotate along the carrier substrate to pick up arrays of semiconductor devices with the pick-up surfaces, and rotate along the display substrate to place the arrays of semiconductor devices from the pick-up surfaces onto the target substrate. The target substrate may be a display substrate, and the semiconductor devices may be light emitting diode (LED) dies, such as µLED dies.

In one embodiment, a pick and place head (PPH) may include a core, a first polymeric protective layer, a first electrode layer, a polymeric piezoelectric layer, a second electrode layer and a second polymeric protective layer. The core has a polygon shaped cross-section where each edge of the polygon shaped cross section defines a pick-up surface of the PPH. The first polymeric protective layer surrounds the core. The first electrode layer surrounds the first polymeric protective layer. The polymeric piezoelectric layer surrounds the first electrode layer. The second electrode layer surrounds the polymeric piezoelectric layer. The second electrode layer in conjunction with the first electrode layer and the polymeric piezoelectric layer form a contact sensor for PPH to detect mounting or releasing of one or more semiconductor devices, such as LED dies. The second polymeric protective layer surrounds the second electrode layer.

BRIEF DESCRIPTION OF THE DRAWINGS

FIG. 4 is a flowchart illustrating a process for picking up LED dies using a PPH, in accordance with one embodiment.

FIGS. 10A through 12B illustrate a sequence of picking and placing LED dies using a PPH, in accordance with one embodiment.

FIG. 14 is a flowchart illustrating a process for picking and placing LED dies using a PPH, in accordance with one embodiment.

FIG. 17 is a plan view illustrating a display substrate including red, green, and blue LED dies of a pixel placed in a single placement cycle, in accordance with one embodiment.

DETAILED DESCRIPTION

Figure 1A:
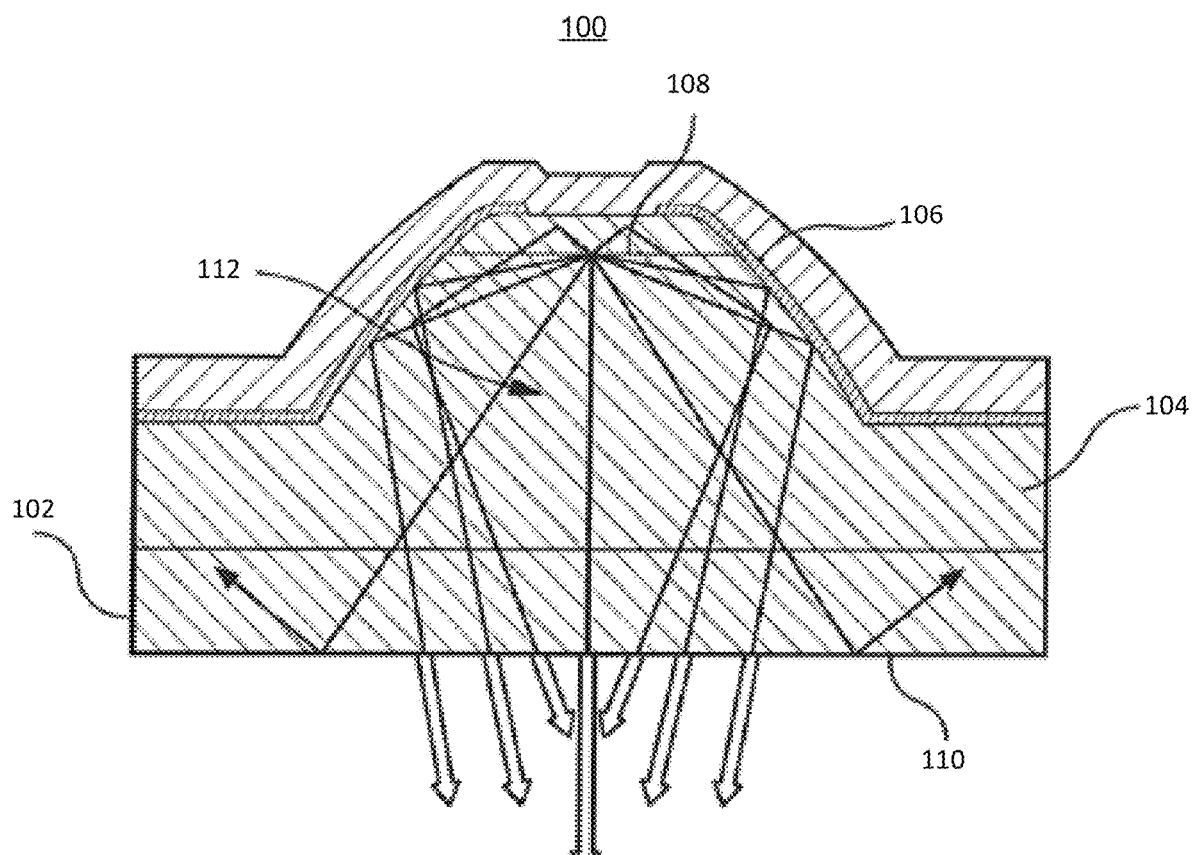
FIG. 1A is a cross sectional view of a µLED, in accordance with one embodiment.

The Figures and the following description relate to embodiments by way of illustration only. It should be noted that from the following discussion, alternative embodiments of the structures and methods disclosed herein will be readily recognized as viable alternatives that may be employed without departing from the principles disclosed herein.

Embodiments relate to placing semiconductor devices on a target substrate using a pick and place head (PPH). The PPH has a cross-section of a polygon shape and pick-up surfaces. Each pick-up surface picks up an array of semiconductor devices from a carrier substrate mounted with the semiconductor devices. The PPH may be rotated across the carrier substrate to pick up additional arrays of semiconductor devices on other pick-up surfaces. Semiconductor dies mounted to the PPH are placed on a target substrate. The PPH may be rotated across the target substrate to place the arrays of semiconductor devices on each of the pick-up surfaces. The semiconductor devices may be LED dies, and the target substrate may be a display substrate. PPH provides for efficient pick up and placement of (e.g., 2 dimensional) arrays of LED dies on the display substrate. The PPH populates each pixel of the display substrate with LED dies, where each pixel includes multiple sub-pixels of different color LED dies to emit light of different colors from the pixel. For example, each pixel of the display may include a green sub-pixel formed by a green LED, a red sub-pixel formed by a red LED, and a blue sub-pixel formed by a blue LED. The PPH may pick up arrays of different color LED dies in different orders or arrangements at the pick-up surfaces o improve LED die placement efficiency and/or accuracy at sub-pixel locations on the display substrate.

A scanning electron microscope (SEM) is used to align the PPH with the carrier substrate during LED die pick up, and with the display substrate during LED die placement. The movement of the PPH, including rotations, is controlled based on the alignment to pick-up arrays of LED dies at multiple pick-up surfaces, and place the arrays of LED dies at the sub-pixel locations of the display substrate.

The PPH includes a polymeric piezoelectric layer, an inner electrode layer, and an outer electrode layer. These layers form a contact sensor that generates a contact signal indicating pick up or placement of the LED dies by the PPH. The contact signal also can be used to control the force of contact during pick up or placement. The force of contact is limited to avoid damaging the LED dies.

In some embodiments, the LED dies may include μLED dies. The techniques discussed herein may be particularly adapted to efficiently and accurately place small LED dies, such as μLED dies, at the sub-pixel locations on a display substrate. The μLED described herein refers to a micron size ILED device (e.g., less than 20 μm in diameter) that directionalizes light output and enhances the brightness level observed by the user.

Example Micro LED

FIG. 1A is a cross sectional diagram illustrating a μLED 100, in accordance with one embodiment. The μLED 100 may include, among others, a substrate 102, an epitaxial layer 104 shaped into a mesa 106, an active light emitting layer 108, and a light emitting region 110. The μLED 100 may be less than 20 pm in diameter with a parabolic structure etched onto the LED die during wafer processing to form a quasi-collimated light beam emerging from the light emitting face 110. The μLED 100 includes high light extraction efficiency and outputs quasi-collimated light because of its shape.

The epitaxial layer 104 is disposed on the substrate 102. The active light emitting layer 108 is enclosed in the mesa 106. The mesa 106 has a truncated top, on a side opposed to the light emitting region 110. The mesa 106 has a curved or near-parabolic shape to form a reflective enclosure for light within the μLED 100. The arrows 112 show how light emitted from the active light emitting layer 108 is reflected off the walls of the mesa 106 toward the light emitting region 110 at an angle sufficient for the light to escape the μLED 100 (e.g., within the angle of total internal reflection). The electrical contact pads of the device are not shown in FIG. 1A but may be located on the opposite surface to the emitting face 310.

This structure of the μLED 100 results in an increase in the efficiency of light emission when compared to unshaped or standard LED chips. As such, the μLED 100 produces light visible to the human eye with reduced current (e.g., nano-amps of drive current). Additional details regarding μLEDs, applicable in some embodiments, are discussed in U.S. Pat. No. 7,518,149, which is incorporated by reference herein in its entirety.

Figure 1B:
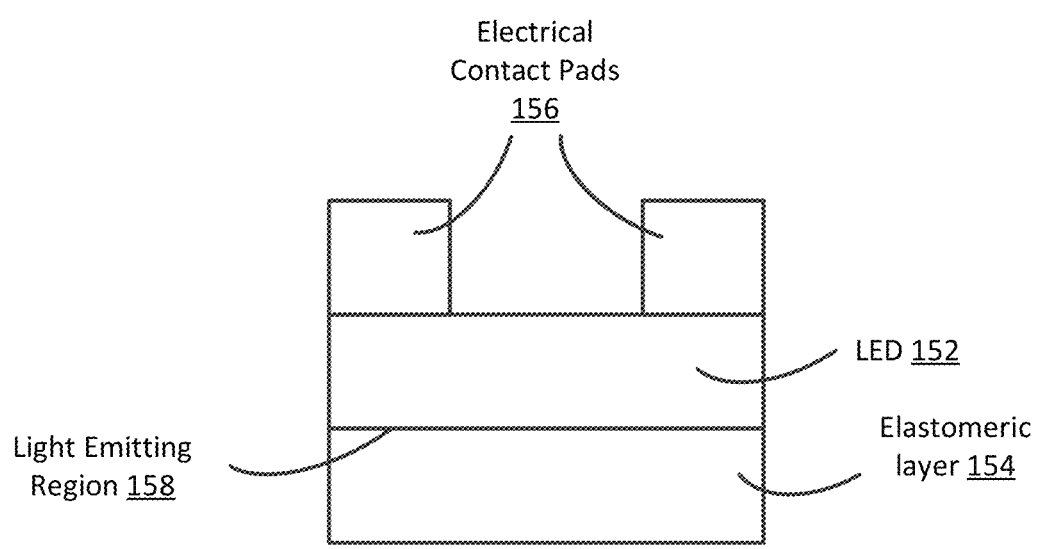
FIG. 1B is a cross sectional view of an LED die, in accordance with one embodiment.

FIG. 1B is a cross sectional view of an LED die 150, in accordance with one embodiment. The LED die 150 may include, among others, a LED 152, an elastomeric layer 154, and electrical contact pads 156. The LED 152 may be a μLED 100, or may be some other type of LED. The LED 152 may be the μLED 100 shown in FIG. 1, or may be a different type of LED. The electrical contact pads 156 serve as interconnects for the LED die 150 when the LED die 150 is mounted to a display substrate. The elastomeric layer 154 is disposed on the light emitting region 158 of the LED 152. As discussed in greater detail below with reference to FIG. 1B, the elastomeric layer 154 facilitates attachment of the LED die 150 with pick-up surfaces of a pick and place head (PPH).

The techniques discussed herein, such as the use of a PPH to pick and place, is not limited to small semiconductor devices like μLED dies, and may also be applied to larger semiconductor devices with more relaxed spacing parameters.

Display Assembly System

Figure 2:
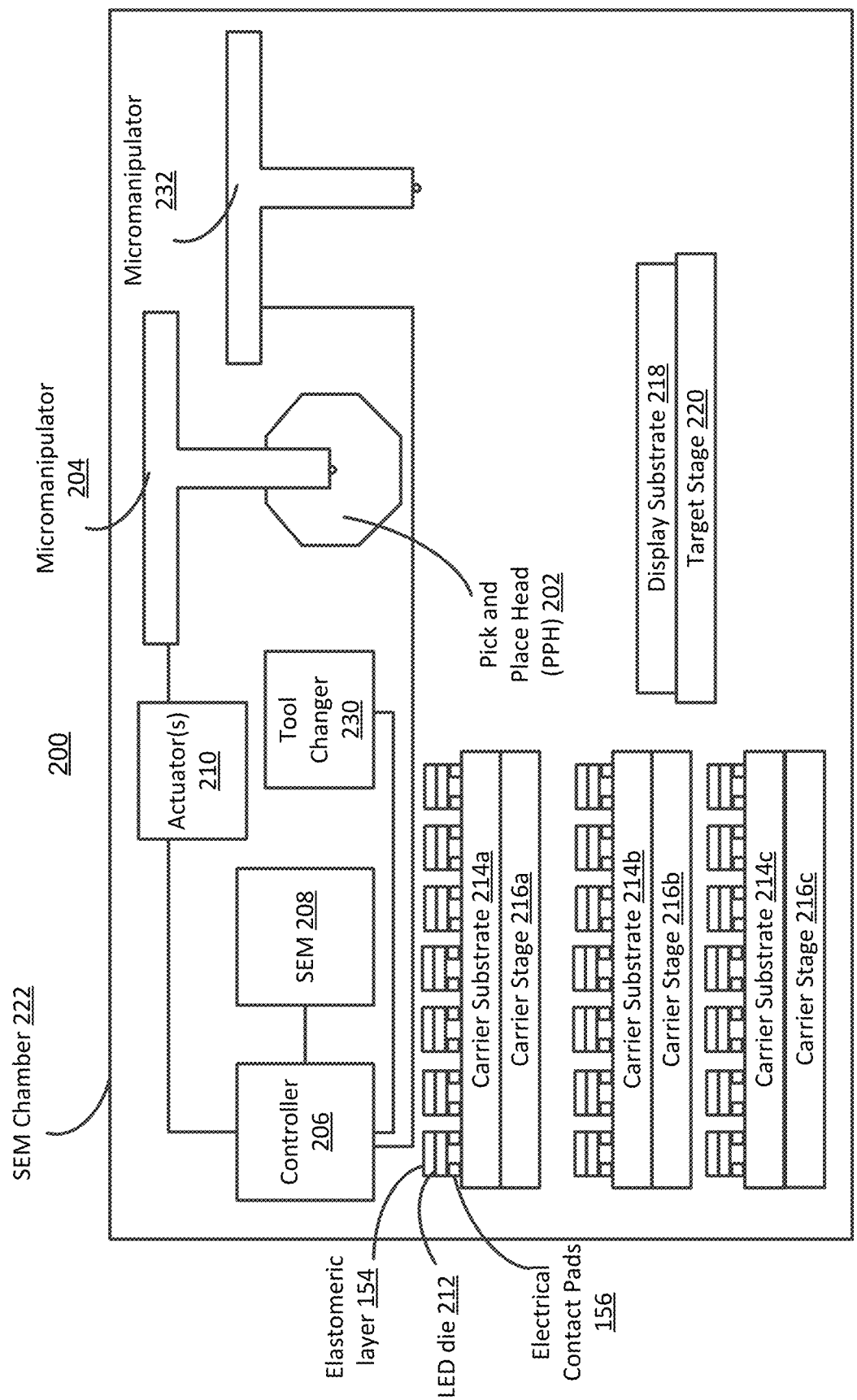
FIG. 2 is an overall system diagram of a display assembly system, in accordance with one embodiment.

FIG. 2 is an overall system diagram of a display assembly system 200, in accordance with some embodiments. The system 200 fabricates a display device by assembling LED dies 212 onto a display substrate 218. For example, different color LED dies 212 may be placed at pixel locations of the display substrate 218, and then bonded to the substrate 218. The system 200 may include, among other components, a scanning electron microscope (SEMS) chamber 222 defining an interior environment for picking and placing LED dies 212 within the SEM chamber 222. The system 200 includes a pick and place head (PPH) 202, micromanipulator 204, micromanipulator 232, controller 206, scanning electron microscope (SEM) 208, actuator(s) 210 and a tool changer 230 enclosed with the SEMS chamber 222. The system 200 further includes carrier stages 216a, 216b, and 216c, and a substrate stage 220.

Figure 3A:
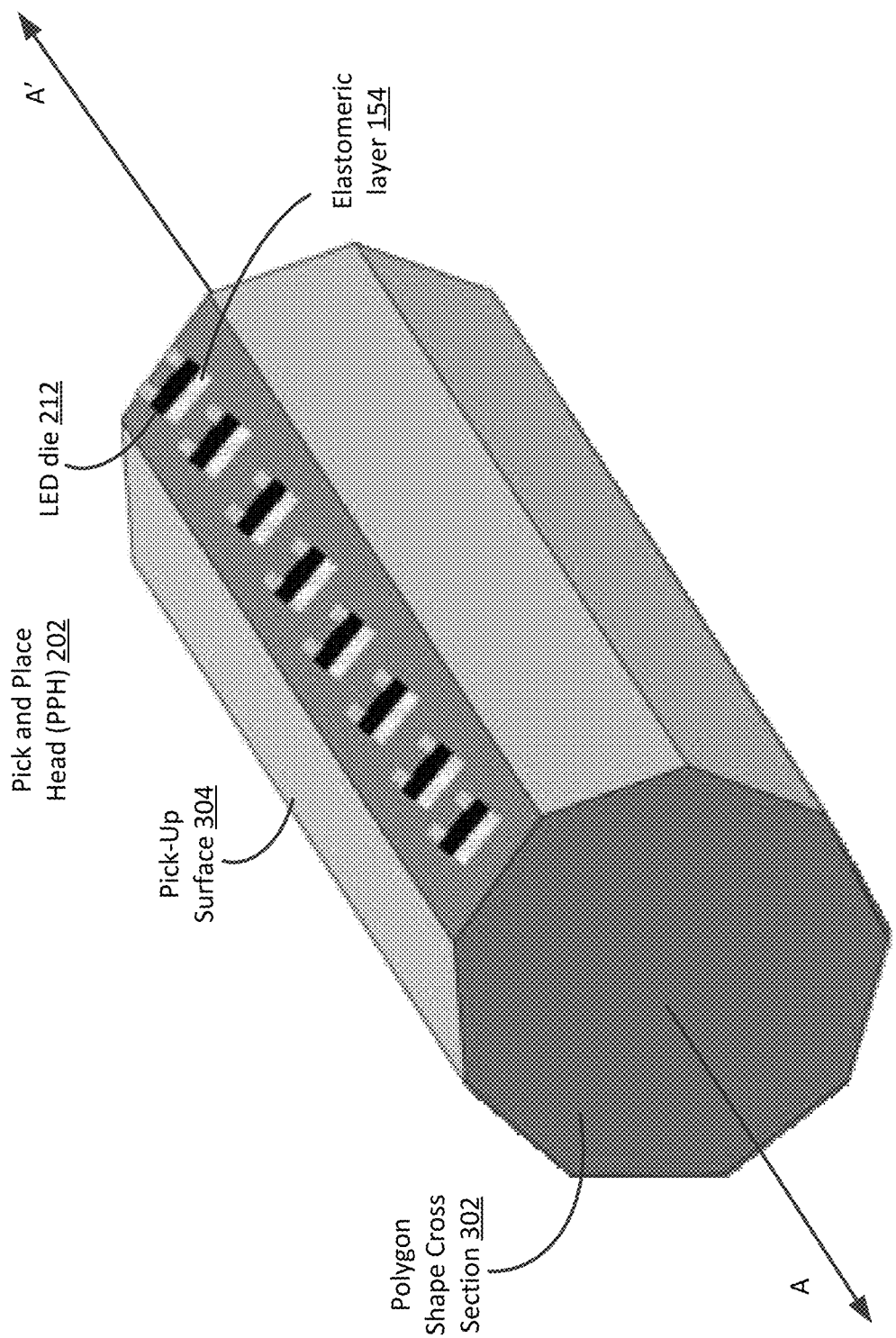
FIG. 3A is a perspective view of a pick and place head (PPH), in accordance with one embodiment.

Although system 200 is discussed as being configured to assemble LED dies 212 on the display substrate 218, system 200 may be used to assemble other types of semiconductor devices on other types of target substrates. For example, the semiconductor devices may include photodiodes. The semiconductor devices may include an elastomeric layer that facilitates attachment of the semiconductor devices with the pick-ups surfaces of the PPH 202. The micromanipulator 204 is connected to the PPH 202 and controls movement of the PPH 202. For example, the micromanipulator 204 may be a multiple degree of freedom micromanipulator, such as a four degree of freedom micromanipulator configured to move the PPH up and down, left and right, forward and back, or rotate the PPH 202 (e.g., along the rotational axis A-A' as shown in FIG. 3a). The micromanipulator 204 is connected with the controller 206. The controller 206 controls the PPH 202 by controlling the micromanipulator 204. In some embodiments, the controller 206 controls the micromanipulator 204 based on controlling one or more actuators 210. The actuators 210 may be part of the micromanipulator 204, or separate components.

In some embodiments, the system 200 includes multiple micromanipulators and/or PPHs that perform pick and place tasks in parallel to increase throughput of the system 200. For example, system 200 may include a micromanipulator 232. The micromanipulator 204 and micromanipulator 232 may be dedicated to different tasks. For example, the micromanipulator 204 controls the PPH 202 to pick up LED dies 212 from a carrier substrate 214, and the populated PPH 202 is removed from the micromanipulator 204. The micromanipulator 232 is attached with the populated PPH 202, and controls the PPH 202 to place the LED dies on mounted to the PPH 202 on the display substrate 218.

In some embodiments, a stage revolver brings the substrate of interest in the working distance of the micromanipulators 204 and 232. Carrier stages 216a through 216c and the target stage 220 are placed on the stage revolver, which may be rotated based on control signal from the controller 206.

The tool changer 230 facilitates removal or attachment of the PPH 202 with the micromanipulator 204 or 232. For example, the tool changer 216 replaces a PPH 202 that is mounted with LED dies with an empty PPH 202. In another example, the tool changer 216 replaces an empty PPH that has placed previously mounted LED dies on the display substrate 218 with a fully populated PPH 202. The tool changer 230 may be a subsystem that provides course positioning for attaching or detaching the PPHs from one micromanipulator to another one.

The SEM 208 facilitates a visual alignment of LED die pick-up from a carrier substrate 214, and alignment of LED die placement on the display substrate 218. For example, the SEM 208 generates images of the PPH 202 and the carrier substrate 214, and provides the images to the controller 206. The controller 206 aligns the PPH 202 with the carrier substrate 214 based on the images, and picks up arrays of LED dies by rolling the aligned PPH 202 across the LED dies 212 mounted on the carrier substrate 214. In another example, the SEM 208 generates images of the PPH 202 and the display substrate 218, and provides the images to the controller 206. The controller 206 aligns the PPH 202 with the display substrate 218 based on the images, and places the arrays of LED dies by rolling the aligned PPH 202 across the display substrate 218. In some embodiments, the SEM 208 is an environmental scanning electron microscope (ESEM) to provide images without specimen coating. The SEM chamber 222 is an ESEM chamber including a high pressure atmosphere of water vapor. The use of an SEM is advantageous for picking and place small LED dies. In various embodiments, other types of imaging devices may be used to facilitate the alignments.

Each carrier stage 216a through 216c holds a respective carrier substrate 214a through 214c. Each of the carrier substrates 214a through 214c is mounted with LED dies 212. The LED dies 212 are mounted on the carrier substrate with the elastomeric layer 154 facing up to facilitate pick up of the LED dies 212 by the PPH 202. In some embodiments, the carrier substrates may be mounted with other types of semiconductor devices, such as photodiodes, to facilitate placement of semiconductor devices.

In some embodiments, the carrier stage(s) 216 and/or target stage 220 may be adjusted to facilitate precision alignment with the PPH 202. For example, the carrier stage 216 and/or target stage 220 may include three degrees of freedom. The degrees of freedom may include left and right, backward and forward, and a yaw rotational degree of freedom. The carrier substrate 214 is moved with the carrier stage 216, and the display substrate 218 is moved with the target stage 220.

The target stage 220 holds a target substrate for LED placement, such as the display substrate 218. The PPH 202 picks up LED dies 212 from a carrier substrate 214, and places the LED dies on the display substrate 218. The system 200 may include one or more carrier substrates 214. For example, different carrier substrates 214 may carry different color LED dies. A carrier substrate 214 may be native substrate on which the LED dies 212 are fabricated, or may be an intermediate carrier substrate to facilitate LED die transfer between a native substrate and the display substrate 218. In some embodiments, the target stage 220 includes a heater for thermal compression bonding of the electrical contact pads 156 of the LED dies 212 to the display substrate 218 subsequent to placement of the LED dies 212 on the display substrate 218 by the PPH 202.

FIG. 3A is a perspective view a PPH 202, in accordance with one embodiment. The PPH 202 has a polygon shaped cross section 302. The edges of the polygon shape cross section 302 define multiple pick-up surfaces 304 of the PPH. The elastomeric layer 154 of the LED dies 212 are configured to mount to the pick-up surfaces 304 to facilitate transfer of the LED dies 212 from a carrier substrate 214 to the display substrate 218. Although the PPH 202 has an octagonal cross section and eight pick-up surfaces 304, a PPH may have different shaped cross sections (e.g., triangular, square, hexagon, etc.) and different numbers of pick-up surfaces in various embodiments.

An array of LED dies 212 are shown in FIG. 3A as being attached along the length of a single pick-up surface 304. Each of the pick-up surfaces 304 can pick up one or more LED dies 212. A rotational axis A-A' of the PPH 202 is defined at the center of the polygon shape cross section 302. As discussed in greater detail below with reference to FIG. 4, the PPH 202 may be rotated along the rotational axis A-A' to pick up arrays of LED dies 212 at one or more pick-up surfaces 304.

Figure 3B:
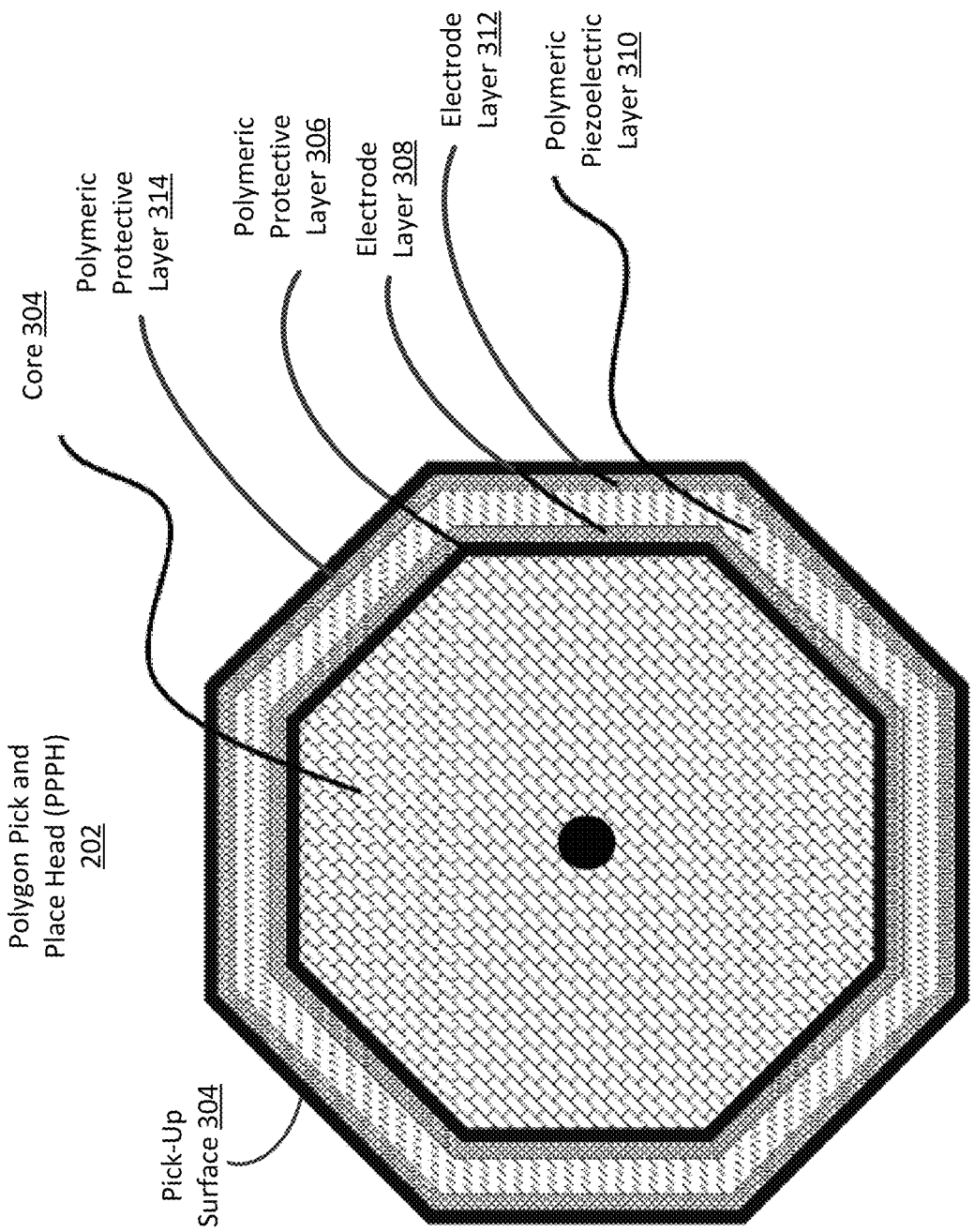
FIG. 3B is a cross sectional view of the PPH, in accordance with one embodiment.

FIG. 3B is a cross sectional view of the PPH 202, in accordance with one embodiment. The PPH 202 may include, among other components, a core 304, an inner polymeric protective layer 306 surrounding the core 304, a first electrode layer 308 surrounding inner first polymeric protective layer 306, a polymeric piezoelectric layer 310 surrounding the first electrode layer 308, a second electrode layer 312 surrounding the polymeric piezoelectric layer 310, and an outer polymeric protective layer 314 surrounding the second electrode layer 312.

The core 304 may include metallic material (e.g., Ti or Ni), or a ceramic material (e.g., sintered $Al_2O_3$). The polymeric protective layers 306, 314 are hard polymers such as Polyurethane with stable properties in high temperatures of around 250° C. The elastomeric layer 154 of the LED die 150 is a conformable layer allowing uniform adhesion distribution between the elastomeric layer 154 and the polymeric protective layer 314. The polymeric protective layer 314 shields and protects the polymeric piezoelectric layer 310, and interfacing the elastomeric layer 154 of the LED die 150 with the PPH 202 using adhesion forces, such as Van der Waals. The layer 306. The polymeric protective layer 306 shields the polymeric piezoelectric layer 310 from the (e.g., metallic) core 304.

The polymeric piezoelectric layer 310, first electrode layer 308, and second electrode layer 312 form a contact sensor for the pick-up surfaces 304. The first and second electrode layers 308 and 312 are connected to the polymeric piezoelectric layer 310, and also connected to the controller 206. The polymeric piezoelectric layer 310 may include polyvinylidene fluoride (PVDF) or elecromechanical film (EMFi).

The polymeric piezoelectric layer 310 detects contact between the pick-up surface 304 and the LED die 212. The polymeric piezoelectric layer 310 may detect vibration caused by compression of the pick-up surface 304, and convert the vibrations into an electrical contact signal. The contact signal is sent from the first and second electrode layers 308 and 312 to the controller 206. The controller 206 uses the contact signal to control the PPH 202. For example, the controller 206 uses the contact signal to identify contact between a pick-up surface 304 and a LED die 212 during pick up and/or place tasks, or to control force of the contact. The controller 206 may be a closed loop controller. The controller 206 measures an error signal between expected force output by the micromanipulator/PPH and the measured force output by the contact sensor over time, and adjusts control of the micromanipulator to minimize the error signal The PPH 202 uses force sensing to control the picking and placing of small dies, such as µLED dies. In some embodiments, other types of contact sensors different from the polymeric piezoelectric layer may be used, such as a capacitive contact sensor. The contact sensor may be integrated within a PPH that includes an inner core and an outer polymeric protective layer that interfaces with the elastomeric layer 154 of the LED die 150 using adhesion forces. Alternatively, the contact sensor is separate from the PPH. As such, some embodiments include using a force sensor with a PPH for microassembly of µLEDs.

Display Assembly

FIG. 4 is a flowchart illustrating a process 400 for picking up LED dies with a PPH, in accordance with one embodiment. Process 400 may be performed by the display assembly system 200 to manufacture a display device by transferring LED dies from a carrier substrate to a display substrate. Process 400, as well as the other processes discussed herein, may be particularly advantageous when the LED dies are µLEDs dies having small dimensions (e.g., less than 20 µm in diameter, with interconnect size of 500 nm).

Figure 5:
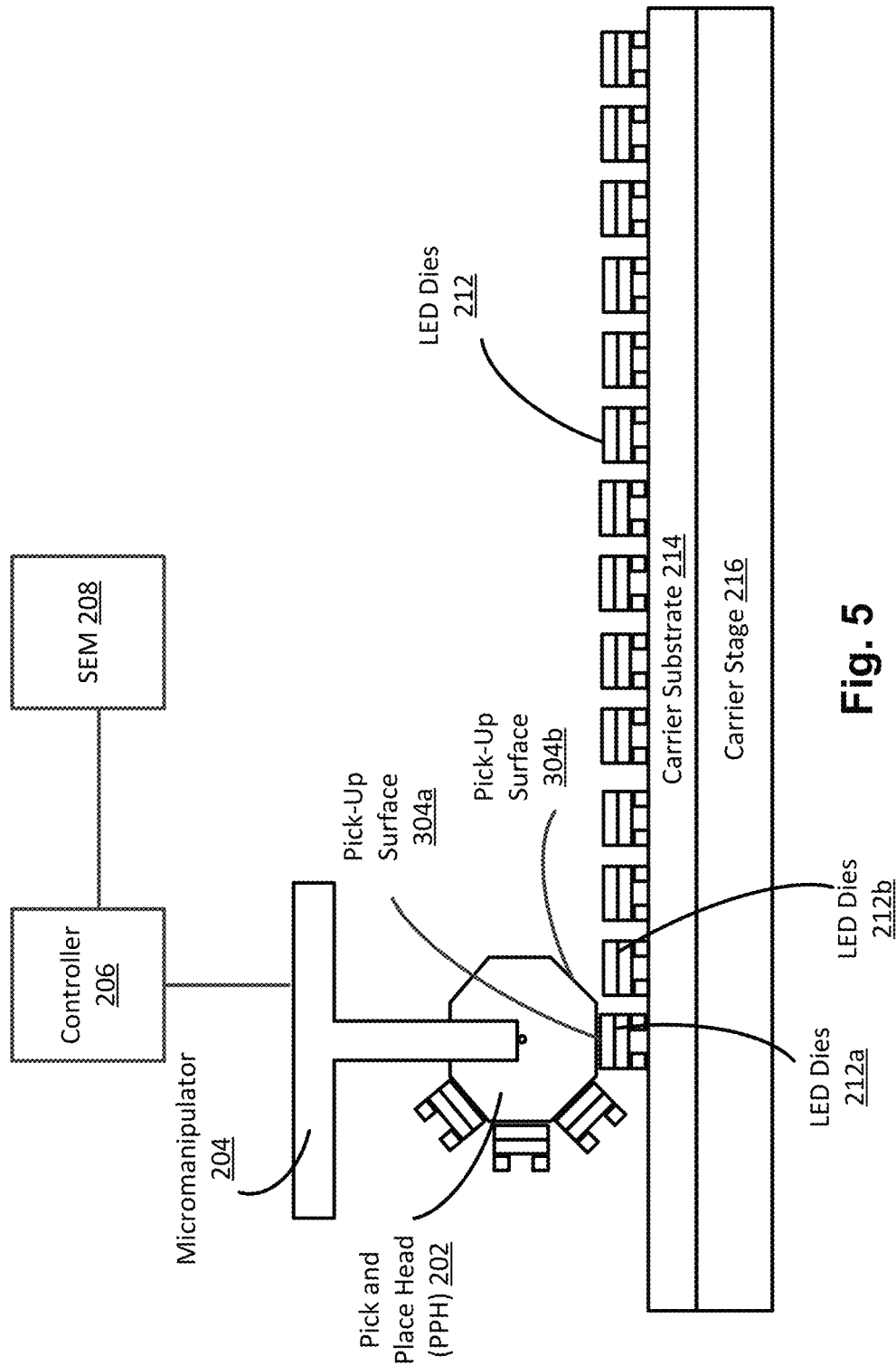
FIG. 5 is a schematic diagram illustrating picking up of LED dies using a PPH, in accordance with one embodiment.

First, the PPH 202 is aligned 410 with a carrier substrate 214. FIG. 5 shows pick up of LED dies 212 with a PPH 202, in accordance with one embodiment. The SEM 208 generates an image of the PPH 202 and the carrier substrate 214, and provides the image to the controller 206. Based on the image indicating the relative positions of the PPH 202 and the carrier substrate 214, the controller 206 sends a control signal to the micromanipulator 204 to move the PPH 202.

The PPH 202 is aligned with the carrier substrate 214 such that a pick-up surface 304a is aligned with an array of LED dies 212a. Although shown as a single LED die 212a is shown in the side view of FIG. 5, the LED dies 212a include an array of LED dies that can be picked up along the length of the pick-up surface 304a (e.g., as shown in FIG. 3A). Furthermore, the alignment is such that the PPH 202 can be rotated in a line along the arrays of LED dies 212 to pick up the arrays of LED dies 212 on multiple pick-up surfaces 304.

In some embodiments, aligning the PPH 202 may include moving the PPH 202 along a backward and forward axis, and/or a left and right axis, to position the PPH 202 over the carrier substrate 214. In some embodiments, aligning the PPH 202 and the carrier substrate 214 may include adjusting position of the carrier substrate 214. For example, the controller 206 may control the carrier stage 216, and adjust the position of the carrier stage 216 along one or more of the three degrees of freedom.

The PPH 202 is moved 420 toward one or more first LED dies 212a on the carrier substrate 214 to pick up one or more first LED dies with a first pick-up surface 304a of the PPH 220. For example, subsequent to the alignment, the PPH 202 is lowered toward the array of LED dies 212a to pick up the array of LED dies 212a with the pick-up surface 304a.

The controller 206 receives 430 a contact signal from a polymeric piezoelectric layer 310 of the PPH 202 indicating the PPH 202 has picked up the one or more first LED dies 212a. The polymeric piezoelectric layer 310, along with the electrode layers 308 and 312, provide a contact sensor for the PPH 202. The contact signal may indicate that a force of contact between the PPH 202 and the LED dies 212a. In some embodiments, the controller 406 moves the PPH 202 toward the one or more first LED dies 212a on the carrier substrate 214 until the force of contact exceeds a threshold force value. The threshold force value may be set to ensure application of sufficient force to pick up the LED dies 212 via contact, and also to limit the force of contact to avoid damaging the LED dies 212, carrier substrate 214, PPH 202, etc.

Subsequent to the PPH 202 picking up the one or more first LED dies 212a with the first pick-up surface 403a, the PPH 202 is rotated 440 to pick up one or more second LED dies 212b with a second pick-up surface 403b of the PPH 202. The second pick-up surface 403b may be adjacent to the first pick-up surface 304a as shown in FIG. 5, or may be a non-adjacent pick-up surface to the first pick-up surface 304a.

The controller 206 receives 450 a contact signal from the polymeric piezoelectric layer 310 of the PPH indicating the PPH 202 has picked up the one or more second LED dies. A contact signal may be used for each pick up by a pick-up surface 304 of the PPH 202 to indicate a successful pickup before the PPH 202 is rotated to pick up additional LED dies with other pick-up surfaces.

The controller 206 determines 460 whether the PPH 202 has been populated with LED dies 212 for placement of the LED dies 212 on the display substrate 218. A PPH 202 may be populated when multiple (e.g., all) pick-up surfaces 304 are populated with an array of LED dies 212, and the PPH 202 is ready for placement of the LED dies 212 onto the display substrate 218.

In response to determining that the PPH has not been (e.g., fully) populated with LED dies, the PPH 202 is further rotated 440 to pick up additional LED dies 212 with one or more unpopulated pick-up surfaces 403 of the PPH 202. The controller 206 receives contact signals for each rotation and pickup cycle indicating LED dies 212 have been picked up before proceeding to a next rotation and pickup cycle. In each rotation and pickup cycle, a pick-surface 403 of the PPH 202 is populated with one or more LED dies. As such, a populated PPH 202 may include an array of LED dies along the length of one or more pick-up surfaces 403.

Returning to 460, in response to determining that the PPH 202 has been populated with LED dies, the PPH 202 is moved 470 away from the carrier substrate 214. For example, the PPH 202 may be lifted away from the carrier substrate 214 for subsequent placement of the LED dies on a display substrate 218. Furthermore, the PPH 202 may be removed from the micromanipulator 204, such as by the tool changer 230. The tool changer 230 may place an empty PPH on the micromanipulator 204, and process 400 may be repeated to pick up LED dies with the empty PPH.

As discussed in greater detail below in connection with FIGS. 9 and 14, a PPH may pick up at least three arrays of color LED dies on at least three pick-up surfaces 403, and then place the color LED dies on a target substrate. The arrays of color LED dies may be LED dies of the same color, or may be LED dies of different color such as red, green and blue LED dies. The LED dies are placed on the target substrate to form the pixels, which each pixel including at least a red, green, and blue LED die.

Figure 6:
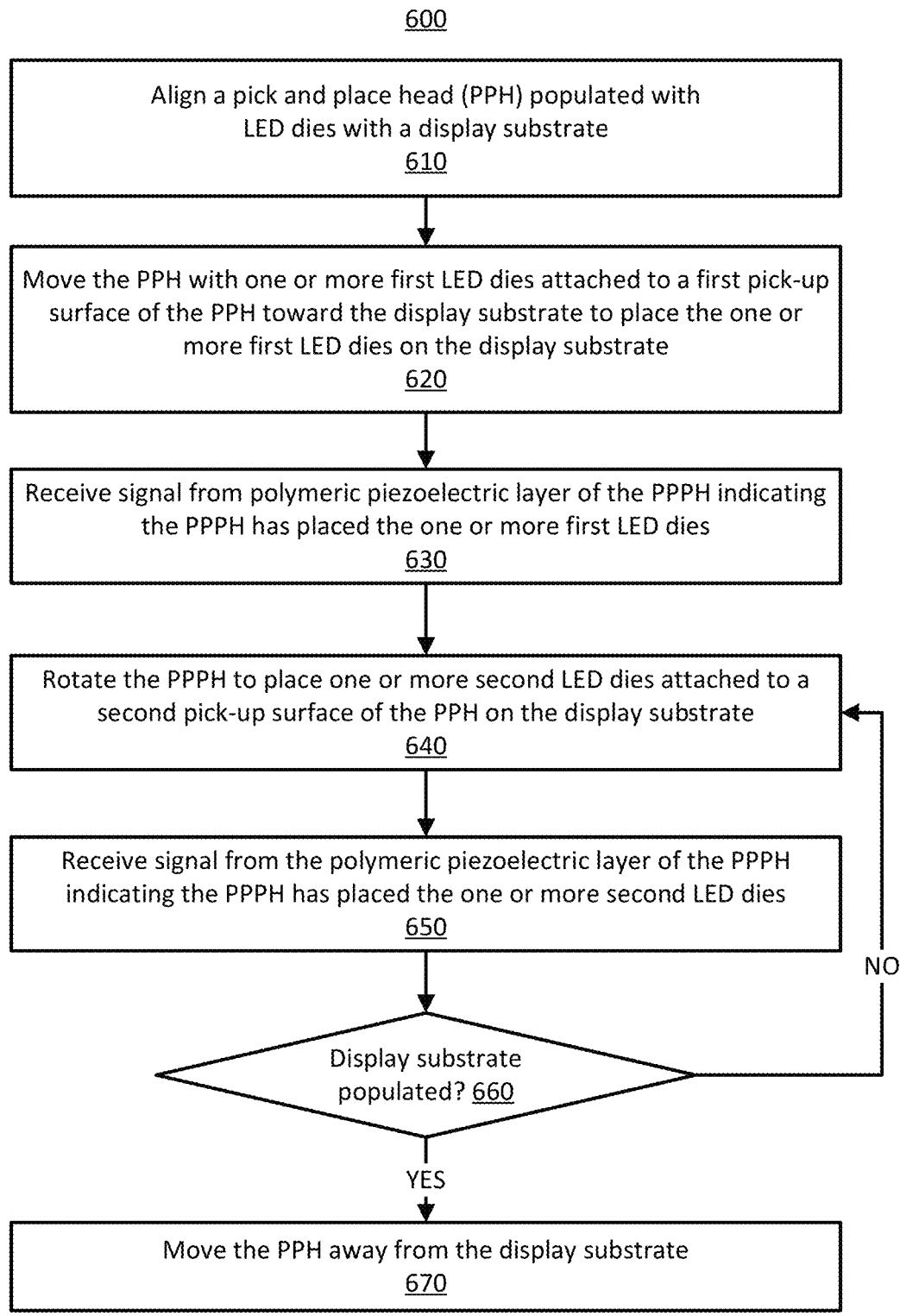
FIG. 6 is a flowchart illustrating a process for placing LED dies using a PPH, in accordance with one embodiment.

FIG. 6 is a flowchart illustrating an example of a process 600 for placing LED dies with a PPH, in accordance with one embodiment. Process 600 may be performed subsequent to process 400 to place the LED dies 212 picked up by the PPH 202 on a display substrate 218 by rotating the PPH 202 along the display substrate 218.

Figure 7:
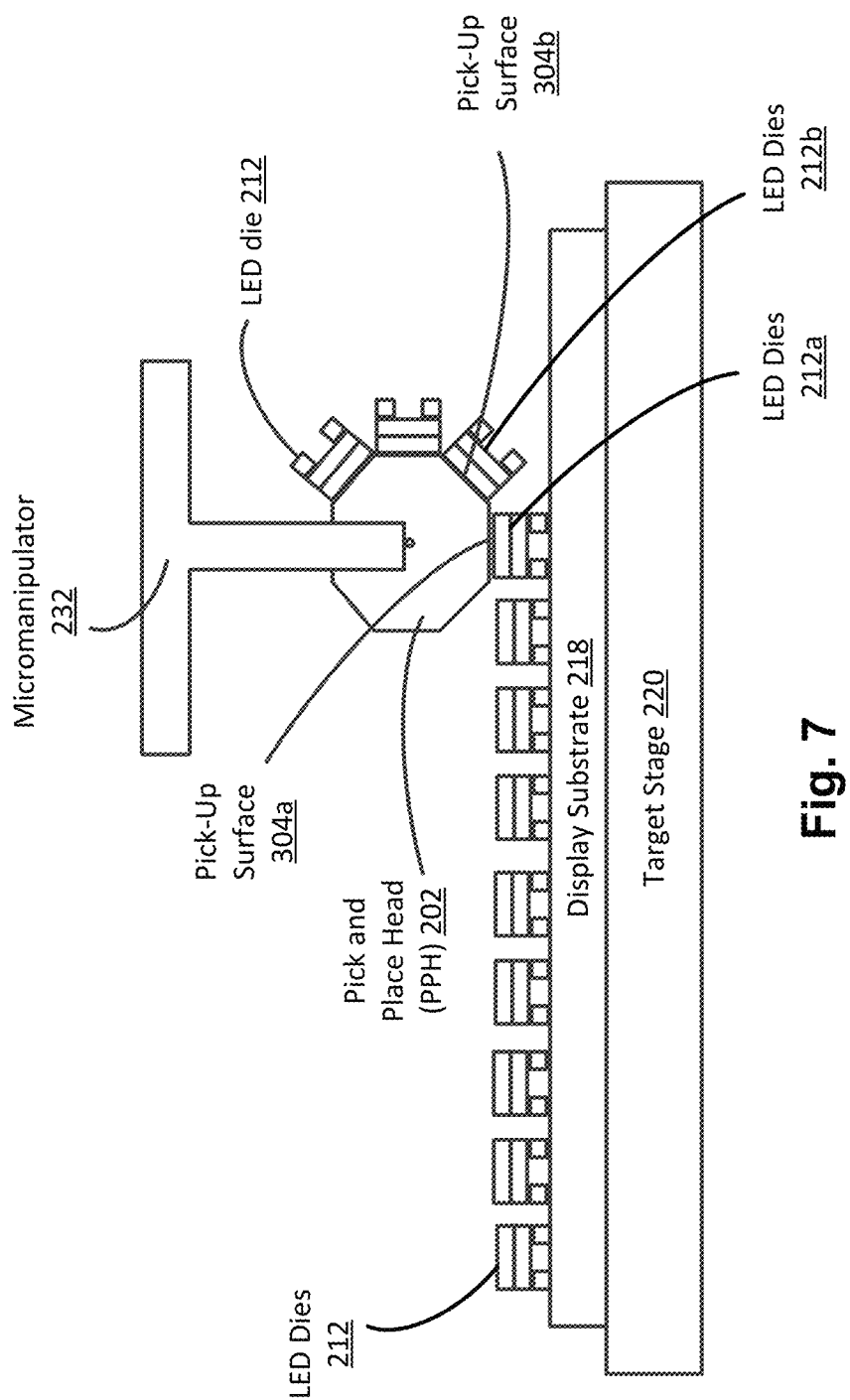
FIG. 7 is a schematic diagram illustrating placement of LED dies using a PPH, in accordance with one embodiment.

The PPH 202 populated with LED dies 212 is aligned 610 with the display substrate 218. FIG. 7 shows a placement of LED dies 212 with a PPH 202, in accordance with some embodiments. The SEM 208 generates an image of the PPH 202 and the display substrate 218, and provides the image to the controller 206. Based on the image indicating the relative positions of the PPH 202 and the display substrate 218, the controller 206 sends a control signal to the micromanipulator 232 to move the PPH 202.

The micromanipulator 232 that controls the PPH 202 during placement of the LED dies may be different from the micromanipulator 204 that controls the PPH 202 during pick up of the LED dies. Here, the tool changer 230 exchanges the populated PPH 202 from the micromanipulator 204 to the micromanipulator 232. In another example, a single micromanipulator 204 controls the PPH 202 during pick up and placement.

The PPH 202 is aligned with the display substrate 218 such that the pick-up surface 304a including an array of LED dies 212a along the length of the pick-up surface 304a is aligned with a corresponding die placement location for the array of LED dies 212a on the display substrate 218. Furthermore, the alignment is such that the PPH 202 can be rotated in a line along the display substrate 218 to place the arrays of LED dies 212 on multiple pick-up surfaces 304 of the PPH 202 on the display substrate 218.

In some embodiments, aligning the PPH 202 may include moving the PPH 202 along a backward and forward axis, and/or a left and right axis, to position the PPH 202 over the display substrate 218. In some embodiments, aligning the PPH 202 and the display substrate 218 may include adjusting position of the display substrate 218. For example, the controller 206 may control the substrate stage 220, and adjust the position of the substrate stage 220 along one or more of the three degrees of freedom.

The PPH 202 is moved 620 with the one or more first LED dies 212a attached to the first pick-up surface 403a of the PPH 202 toward the display substrate 218 to place the one or more first LED dies 212a on the display substrate 218. For example, subsequent to the alignment, the PPH 202 is lowered toward the display substrate 218 to place the LED dies 212a on the display substrate 218.

The controller 206 receives 630 a contact signal from the piezoelectric layer 310 of the PPH 202 indicating the PPH 202 has placed the one or more first LED dies 212a. Although shown in FIG. 7 as a single LED die from the side view, the first LED dies 212a may include an array of LED dies, which are transferred from the carrier substrate 214 to a length of a pick-up surface 403, and then to the display substrate 218. The contact signal may indicate that a force of contact between the PPH 202 and the LED dies 212a, and/or the LED dies 212a and the display substrate 218. In some embodiments, the controller 406 moves the PPH 202 toward the display substrate 218 until the force of contact exceeds a threshold force value. The threshold force value may be set to ensure application of sufficient force to place the LED dies 212 on the display substrate 214 via contact, and also to limit the force of contact to avoid damaging the LED dies 212, display substrate 218, PPH 202, etc.

Subsequent to the PPH 202 placing the one or more first LED dies 212a attached with the first pick-up surface 403a on the display substrate 218, the PPH 202 is rotated 440 to place one or more second LED dies 212b attached to the second pick-up surface 403b of the PPH 202 on the display substrate 218. The second pick-up surface 403b may be adjacent to the first pick-up surface 304a as shown in FIG. 5, or may be a non-adjacent pick-up surface to the first pick-up surface 304a.

The order of LED die pick up from the carrier substrate 214 by the PPH 202 may be different from, or the same as, the order of placement of the LED dies on the display substrate 218. For example, the one or more second LED dies 212b picked up after the one or more first LED dies 212a in process 400 may be placed before the one or more first LED dies 212a in process 600.

The controller 206 receives 650 a contact signal from the polymeric piezoelectric layer 310 of the PPH indicating the PPH 202 has picked up the one or more second LED dies 450. A contact signal may be used for each pick up by a pick-up surface 304 of the PPH 202 to indicate a successful pickup before the PPH 202 is rotated to pick up additional LED dies with other pick-up surfaces.

The controller 206 determines 660 whether the display substrate 218 has been populated with the LED dies 212 previously attached to the PPH 202. The display substrate 218 may be populated when each of the LED dies 212 on the pick-up surfaces 304 have been transferred to the display substrate 218. In another example, the display substrate 218 may be populated when the die placement locations of the display substrate 218 have been filled, even if LED dies 212 remain on the PPH 202.

In response to determining that the display substrate 218 has not been (e.g., fully) populated with LED dies 212, the PPH 202 is further rotated 640 to place additional LED dies 212 attached with populated pick-up surfaces 403 of the PPH 202. The controller 206 receives contact signals for each rotation and placement cycle indicating LED dies 212 have been placed before proceeding to a next rotation and placement cycle. In each rotation and placement cycle, LED dies attached with a pick-up surface 403 are transferred to the display substrate 218. As such, the display substrate 218 may include a two dimensional array of LED dies, a first dimension resulting from rotating the PPH 202 in a line across the display substrate 218, and a second dimension created by the array of LED dies along the length of each pick-up surface 304.

Returning to 660, in response to determining that the display substrate 218 has been populated with LED dies from the PPH 202, the PPH 202 is moved 670 away from the display substrate 218. For example, the PPH 202 may be lifted away from the display substrate 218 for a subsequent pick up of LED dies from a carrier substrate 214 and a placement of the picked up LED dies on the display substrate 218, and so forth.

Figure 8:
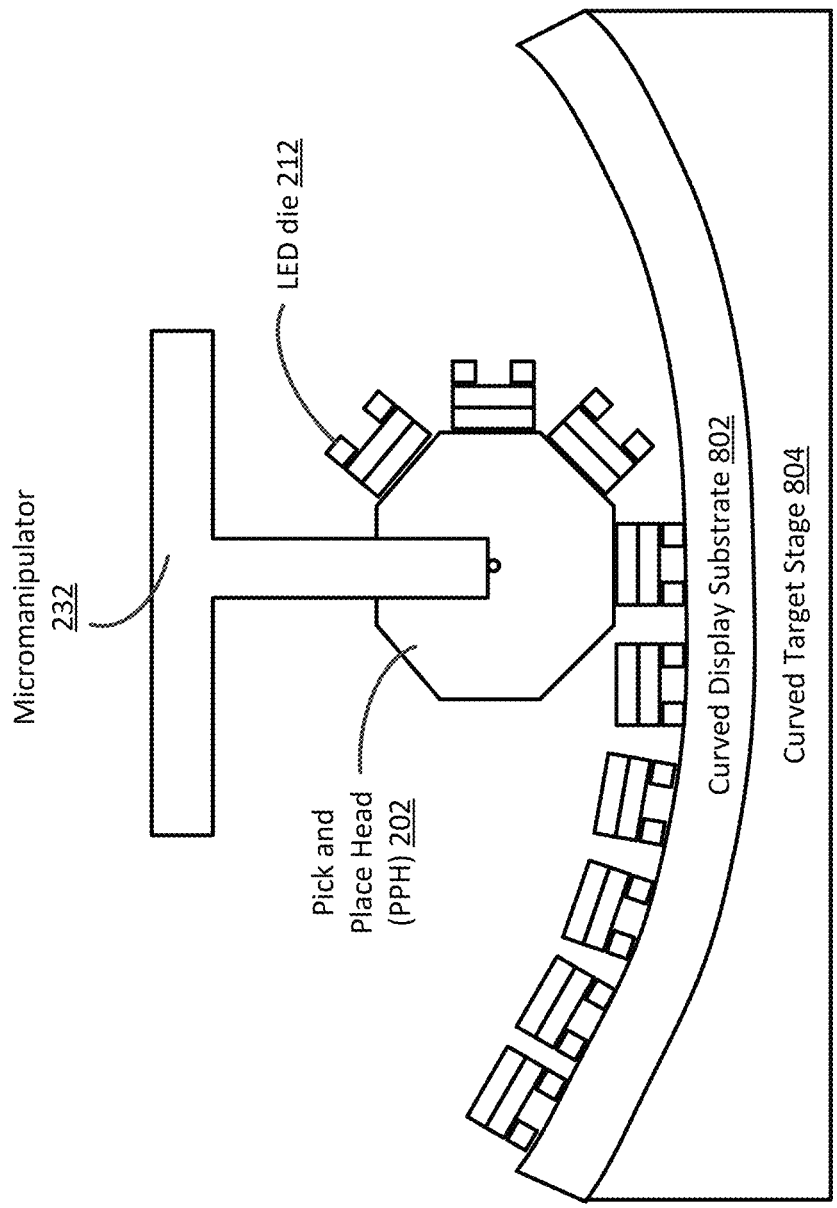
FIG. 8 is a schematic diagram illustrating placement of LED dies using a PPH on a curved display substrate, in accordance with one embodiment.

In some embodiments, the display substrate includes a curved surface onto which LED dies are placed. FIG. 8 shows a placement of LED dies 212 with a PPH 202 on a curved display substrate 802, in accordance with some embodiments. The PPH 202 is adapted to handle placement of LED dies on surfaces of different curvature, such as by controlling the amount of rotation to align the LED dies 212 on a pick-up surface with the curvature of the surface. The system 200 may further include a curved target stage 804 to hold the curved display substrate 802. The curved target stage may include heater for thermal compression bonding of the electrical contact pads 156 of the LED dies 212 to the curved display substrate 802 after placement. In some embodiments, a carrier substrate may include a curved surface, and the PPH picks up LED dies from the curved surface.

Figure 9:
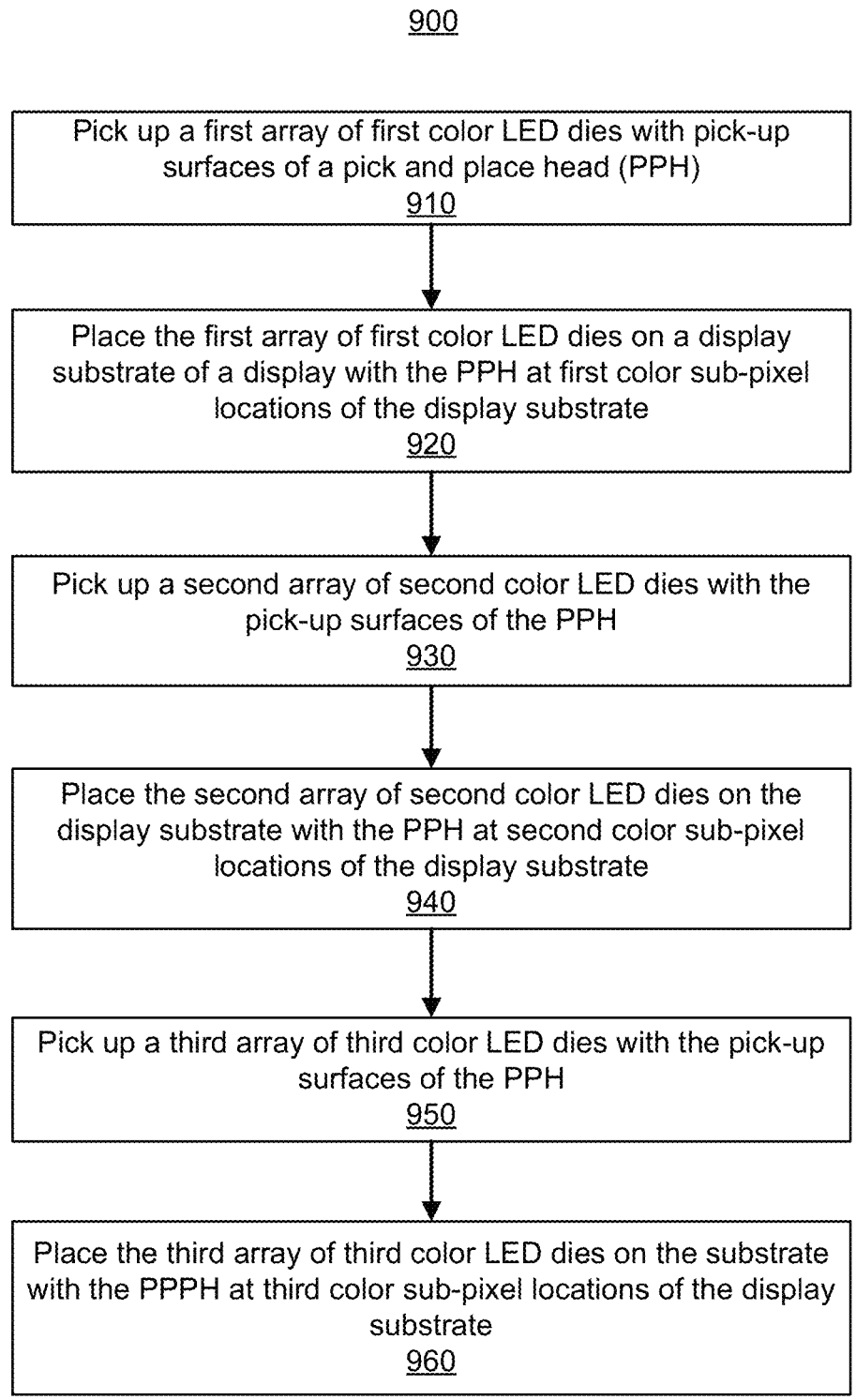
FIG. 9 is a flowchart illustrating a process for picking and placing LED dies using a PPH, in accordance with one embodiment.

FIG. 9 is a flowchart illustrating a process 900 for picking and placing LED dies with a PPH, in accordance with one embodiment. Process 900 provides for high efficiency manufacture a display with sub-pixels of different color LED dies at each pixel of the display, such as a first color LED die, a second color LED die, and a third color LED die at each pixel. Process 900 is discussed with reference to FIGS. 10A through 13, where the first color LED dies are red LED dies, the second color LED dies are green LED dies, and the third color LED dies are blue LED dies.

The PPH 202 picks up 910 a first array of first color LED dies with pick-up surfaces 304 of the PPH 202. FIG. 10*a* shows the PPH 202 populated with an array of red LED dies 1008, in accordance with some embodiments. An array of red LED dies is mounted along the length of each of the pick-up surfaces, and multiple pick-up surfaces are populated with arrays of red LED dies. Thus, the first array of first color LED dies may refer to two-dimensional array of LED dies when the LED dies attached to the PPH 202 are placed on the display substrate 218. The PPH 202 may pick up the first array of first color LED dies, as discussed above in detail with reference to FIG. 4. For example, the PPH 202 may be aligned with a carrier substrate 214, and rotated along the carrier substrate 214 to pick up the first array of the first color LED dies with the pick-up surfaces.

Subsequent to picking the first array of first color LED dies, the PPH 202 places 920 the first array of first color LED dies on a display substrate 218 at first color sub-pixel locations of the display substrate 218. FIG. 10B shows the display substrate 218 populated with the first array of first color LED dies from the pick-up surfaces of the PPH 202. The PPH 202 may place the first array of first color LED dies as discussed above in detail with reference to FIG. 6. For example, the PPH 202 may be aligned with the display substrate 218, and rotated along the display substrate 218 along the placement direction 1006, to place the red LED dies 1008 at the red sub-pixel locations 1004 of the display substrate 218. The red LED dies placed at the red sub-pixel locations 1004 form a two-dimensional array of red sub-pixels on the display substrate 218.

The PPH 202 picks up 930 a second array of second color LED dies with the pick-up surfaces 403 of the PPH 202. FIG. 11A shows the PPH 202 populated with an array of green LED dies 1108, in accordance with some embodiments. An array of green LED dies is mounted along the length of each of the pick-up surfaces, and multiple pick-up surfaces are populated with arrays of green LED dies. The second array of second color LED dies thus may refer to two-dimensional array of LED dies when the LED dies attached to the PPH 202 are placed on the display substrate 218. The PPH 202 may pick up the second array of second color LED dies as discussed above in process 400.

Subsequent to picking the second array of second color LED dies, the PPH 202 places 940 the second array of second color LED dies on the substrate 218 at second color sub-pixel locations of the display substrate 218. FIG. 11B shows the display substrate 218 populated with the second array of second color LED dies from the pick-up surfaces of the PPH 202. The PPH 202 may place the second array of second color LED dies as discussed above in process 600. For example, the PPH 202 may be aligned with the display substrate 218, and rotated along the display substrate 218 along the placement direction 1006, to place the green LED dies 1108 at the green sub-pixel locations 1104 of the display substrate 218. The green LED dies placed at the green sub-pixel locations 1104 form a two-dimensional array of green sub-pixels on the display substrate 218.

The PPH 202 picks up 950 a third array of third color LED dies with the pick-up surfaces 403 of the PPH 202. FIG. 12A shows the PPH 202 populated with an array of blue LED dies 1208, in accordance with some embodiments. An array of blue LED dies is mounted along the length of each of the pick-up surfaces, and multiple pick-up surfaces are populated with arrays of blue LED dies. The third array of third color LED dies thus may refer to two-dimensional array of LED dies when the LED dies attached to the PPH 202 are placed on the display substrate 218. The PPH 202 may pick up the third array of third color LED dies as discussed above in process 400.

Subsequent to picking the third array of third color LED dies, the PPH 202 places 940 the third array of third color LED dies on the substrate 218 at third color sub-pixel locations of the display substrate 218. FIG. 11B shows the display substrate 218 populated with the third array of third color LED dies from the pick-up surfaces of the PPH 202. The PPH 202 may place the third array of third color LED dies as discussed above in process 600. For example, the PPH 202 may be aligned with the display substrate 218, and rotated along the display substrate 218 along the placement direction 1006, to place the blue LED dies 1208 at the blue sub-pixel locations 1204 of the display substrate 218. The green LED dies placed at the green sub-pixel locations 1104 form a two-dimensional array of blue sub-pixels on the display substrate 218.

Figure 13:
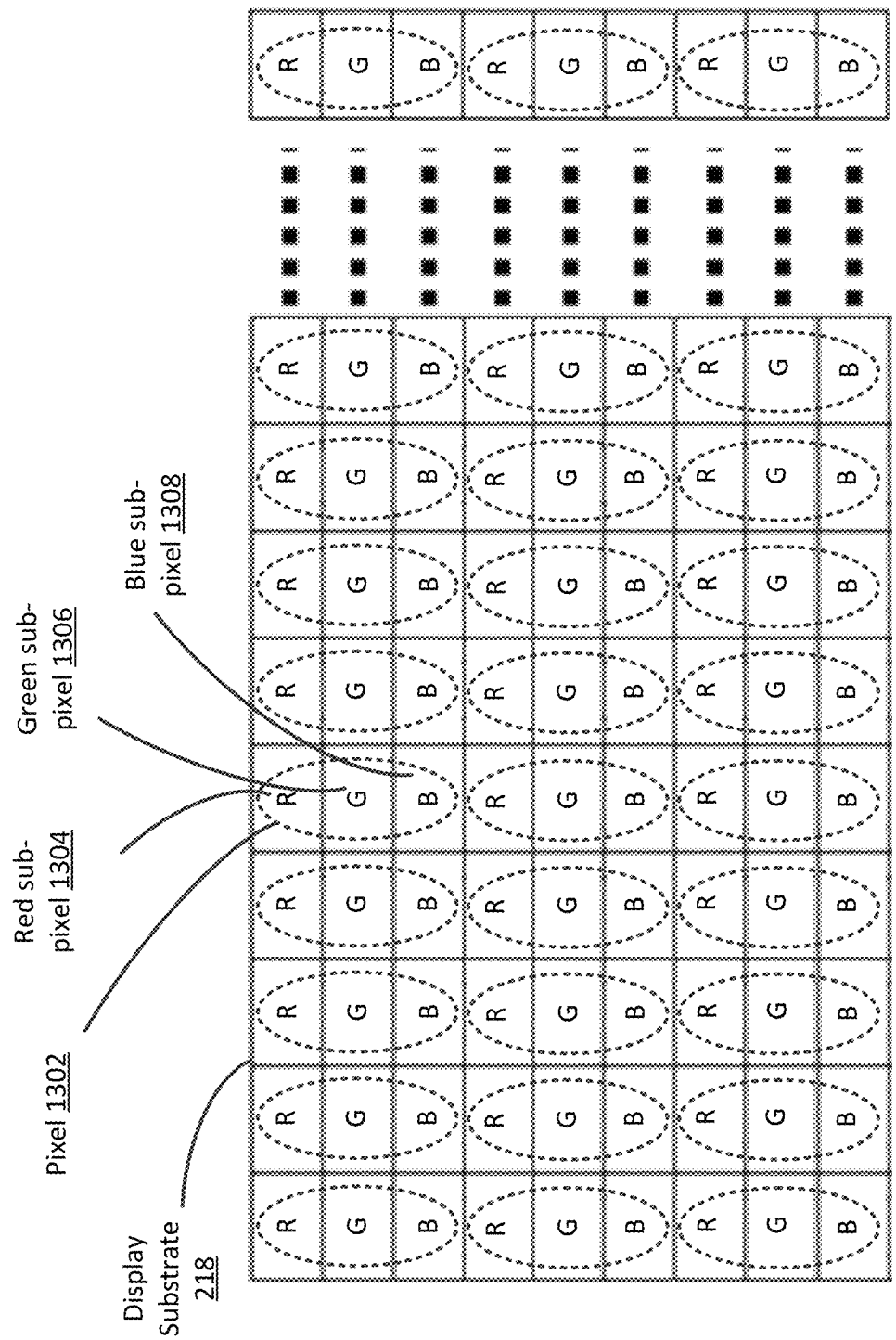
FIG. 13 is a plan view illustrating a display substrate including pixels of red, green, and blue LED dies placed in separate placement cycles, in accordance with one embodiment.

FIG. 13 is a plan view illustrating the display substrate 218 after the arrays of red, green, and blue LED dies have been placed using process 900, in accordance with one embodiment. The display substrate 218 includes multiple (e.g., millions of) pixels 1302. Each pixel 1302 includes a red sub-pixel 1304, a green sub-pixel 1306, and a blue sub-pixel 1308. For each pixel 1302, the sub-pixels 1304-1308 are placed in separate pick and placement cycles as discussed above with reference to FIG. 9. The first, second, and third color LED dies may be picked from different carrier substrates in each placement cycle. Each placement cycle is preceded by a pick-up that includes rotating the PPH 220 across a single carrier substrate, which results in an efficient process for populating multiple pick-up surfaces of the PPH 220 with arrays of LED dies.

During LED die placement, the PPH 220 and the display substrate 218 are carefully aligned, such as by using the SEM 208. Misalignment of the PPH 220 can lead to placement of LED dies outside of their sub-pixel locations on the display substrate, thereby causing relative misalignment of the sub-pixels of a pixel. If the PPH 220 is rotated in a line along the placement direction, a small initial misalignment at the beginning of placement can result in large misalignment toward the end, and thus defective pixels.

In some embodiments, system 200 includes multiple PPHs 220 that operate in parallel to increase the efficiency of placement cycles. For example, a first PPH may pick up the first array of first color LED dies while with a second PPH picking up the second array of second color LED dies. In another example, a first PPH may pick up LED dies from a carrier substrate while a second PPH places LED dies on the target substrate. In some embodiments, a separate PPH 220 is dedicated to the pick and placement of different color LED dies. For example, a first PPH handles transfer of red LED dies, a second PPH handles transfer of green LED dies, and a third PPH handles transfer of blue LED dies.

FIG. 14 is a flowchart illustrating a process 1400 for picking and placing LED dies with a PPH, in accordance with one embodiment. Process 1400 provides for high quality manufacture a display with sub-pixels of different color LED dies at each pixel of the display, such as a first color LED die, a second color LED die, and a third color LED die at each pixel. Unlike process 900, where different color sub-pixels of each pixel are placed in different placement cycles, process 1400 places multiple sub-pixels of a pixel in a single placement cycle. Process 1400 is discussed with reference to FIGS. 15A through 17, where the first color LED dies are red LED dies, the second color LED dies are green LED dies, and the third color LED dies are blue LED dies.

The PPH 202 picks up 1410 a first array of first color LED dies with a first pick-up surface of the PPH 202. Rather than populating each of the pick-up surfaces of the PPH 202 with first color LED dies, the PPH 202 picks up first color LED dies on a subset of pick-up surfaces and leaves the remaining puck-up surfaces open for the attachment of LED dies of different color.

Figure 15A:
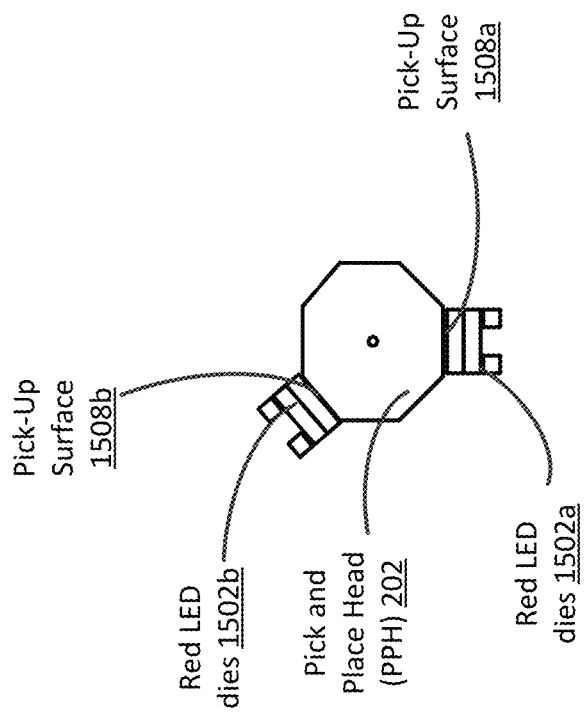
FIGS. 15A through 15c show a sequence of picking LED dies using a PPH, in accordance with one embodiment.

The PPH 202 may be configured to pick up two or more arrays of second color LED dies with two or more non-adjacent pick-up surfaces of the PPH 202. FIG. 15A shows a PPH 202 populated with two arrays of red LED dies 1502*a* and 1502*b*. The red LED dies 1502*a* are attached to the pick-up surface 1508*a*, and the red LED dies 1502*b* are attached to the pick-up surface 1508*b*. The PPH 202 may pick up the red LED dies 1502*a* with the pick-up surface 1508*a*, then rotate the PPH 202 and pick up the red LED dies 1502*b* with the pick-up surface 1508*b*. The pick-up surfaces 1508*a* and 1508*b* are non-adjacent to allow attachment of different color LED dies at pick-up surfaces between the pick-up surfaces 1508*a* and 1508*b*.

Subsequent to picking up the first array of first color LED dies, the PPH 202 picks up 1420 a second array of second color LED dies with a second pick-up surface of the PPH 202. The second pick-up surface of the PPH 202 may be adjacent to the first pick-up surface such that the first and second color LED dies are adjacent to each other when placed on the display substrate 218 (e.g., to form first and second color sub-pixels of the pixels of the display).

Figure 15B:
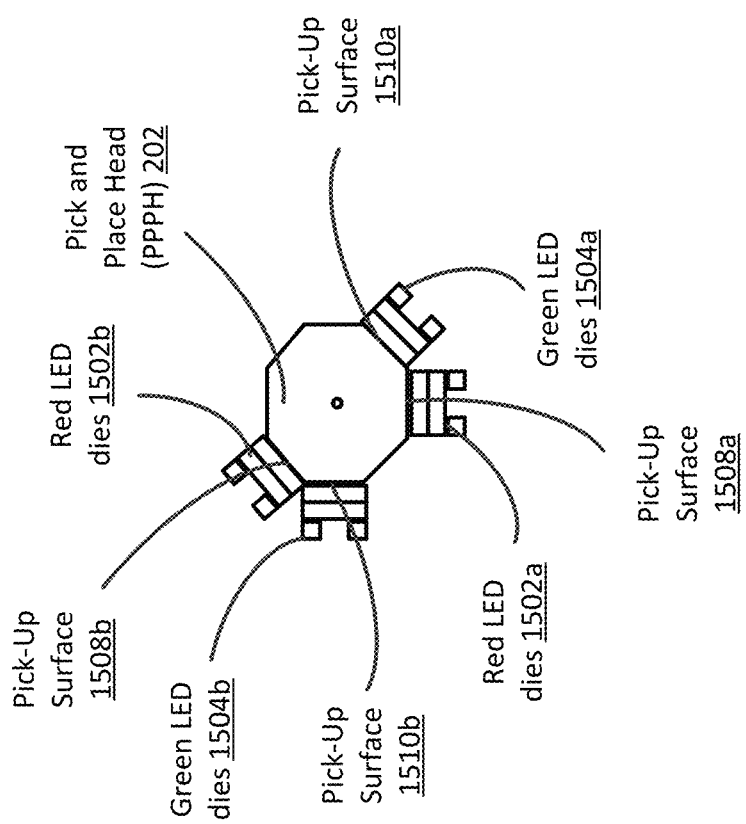

The PPH 202 may be configured to pick up two or more arrays of second color LED dies with two or more non-adjacent pick-up surfaces of the PPH 202. The two or more non-adjacent pick-up surfaces may each be adjacent to a pick-up surface attached with the first color LED dies. FIG. 15B shows the PPH 202 populated with two arrays of green LED dies 1504*a* and 1504*b* subsequent to being populated with the two arrays of red LED dies 1502*a* and 1502*b*. The green LED dies 1504*a* are attached to the pick-up surface 1510*a*, and the green LED dies 1504*b* are attached to the pick-up surface 1510*b*. The PPH 202 may pick up the green LED dies 1504*a* with the pick-up surface 1510*a*, then rotate the PPH 202 and pick up the green LED dies 1504*b* with the pick-up surface 1510*b*. The pick-up surfaces 1510*a* and 1510*b* are non-adjacent to allow attachment of different color LED dies at pick-up surfaces between the pick-up surfaces 1510*a* and 1510*b*. Furthermore, the pick-up surface 1510*a* is adjacent to the pick-up surface 1508*a*, and the pick-up surface 1510*b* is adjacent to the pick-up surface 1508*b*.

Subsequent to picking up the second array of second color LED dies, the PPH 202 picks up 1430 a third array of third color LED dies with a third pick-up surface of the PPH 202. The third pick-up surface of the PPH 202 may be adjacent to the first or second pick-up surface such that the third color LED dies are adjacent to the first or second color LED dies when placed on the display substrate 218 (e.g., to form first, second, and third color sub-pixels of the pixels of the display).

Figure 15C:
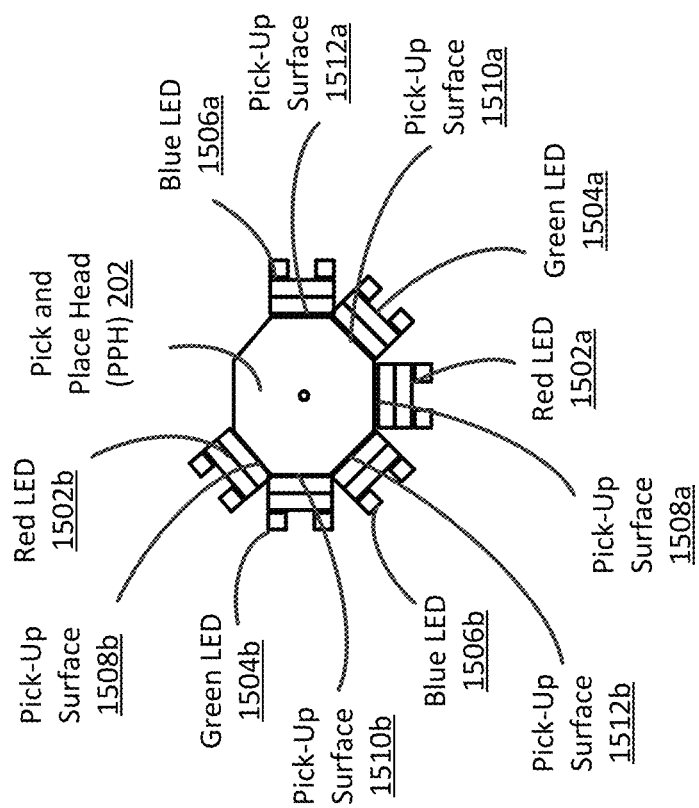

The PPH 202 may pick up two or more arrays of third color LED dies with two or more non-adjacent pick-up surfaces of the PPH 202. The two or more non-adjacent pick-up surfaces may each be adjacent to a pick-up surface attached with the first or second color LED dies. FIG. 15C shows the PPH 202 populated with two arrays of blue LED dies 1506*a* and 1506*b* subsequent to being populated with the two arrays of red LED dies 1502*a* and 1502*b* and the two arrays of green LED dies 1504*a* and 1504*b*. The blue LED dies 1506*a* are attached to the pick-up surface 1512*a*, and the blue LED dies 1506*b* are attached to the pick-up surface 1512*b*. The PPH 202 may pick up the blue LED dies 1506*a* with the pick-up surface 1512*a*, then rotate the PPH 202 and pick up the blue LED dies 1506*b* with the pick-up surface 1512*b*. The pick-up surfaces 1512*a* and 1512*b* are non-adjacent to accommodate attachment of different color LED dies at pick-up surfaces between the pick-up surfaces 1512*a* and 1512*b*. Furthermore, the pick-up surface 1512*a* is adjacent to the pick-up surface 1510*a*, and the pick-up surface 1512*b* is adjacent to the pick-up surface 1510*b*.

Subsequent to picking up the arrays of first, second, and third color LED dies, the PPH 220 places 1440 the first array of first color LED dies at first color sub-pixel locations of the display substrate 218, the second array of first color LED dies at second color sub-pixel locations of the display substrate, and the third array of third color LED dies at third color sub-pixel locations of the display substrate. The placement is performed by rotating the PPH 220 across the surface of the display substrate 218, where the arrangement of LED dies on the pick-up surfaces results in an orderly placement of the LED dies at respective sub-pixel locations to form the pixels of the display.

Figure 16:
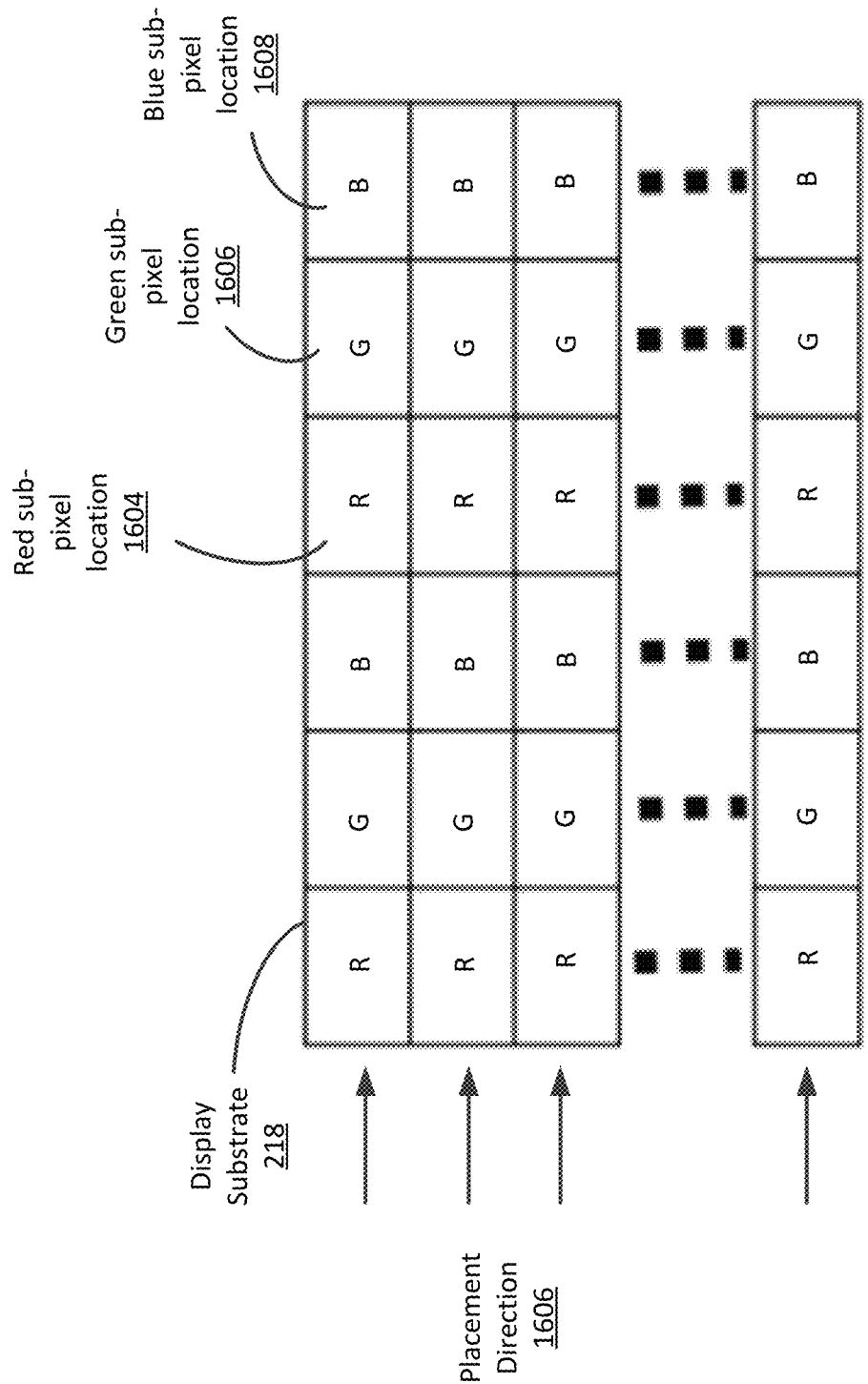
FIG. 16 is a plan view illustrating placing of LED dies, in accordance with one embodiment.

FIG. 16 is a plan view of the display substrate 218 populated with a first array of red LED dies, a second array green LED dies, and a third array of blue LED dies from the pick-up surfaces of the PPH 202, in accordance with one embodiment. The PPH 202 may place the LED dies as discussed above in detail with reference to FIG. 6. The PPH 202 may be aligned with the display substrate 218, and rotated along the display substrate 218 along the placement direction 1606, to place the red LED dies 1502*a* and 1502*b* at the red sub-pixel locations 1604 of the display substrate 218, the green LED dies 1504*a* and 1504*b* at the green sub-pixel locations 1606 of the display substrate 218, and the blue LED dies 1506*a* and 1506*b* at the blue sub-pixel locations 1608 of the display substrate 218.

FIG. 17 is a plan view illustrating the display substrate 218 after the arrays of red, green, and blue LED dies have been placed using process 1400, in accordance with one embodiment. The display substrate 218 includes multiple (e.g., millions of) pixels 1602. Each pixel 1602 includes a red sub-pixel 1604, a green sub-pixel 1606, and a blue sub-pixel 1608. For a pixel 1602, the sub-pixels 1604-1608 are placed a single placement cycle as discussed in process 1400. The first, second, and third color LED dies may be picked from different carrier substrates prior to the placement cycle. Each placement cycle is preceded by rotating the PPH 220 across multiple carrier substrates. Although process 1400 may be less efficient at LED die pick up compared with process 900 (e.g., where each pick up cycle of the PPH picks up single color LED dies from a single carrier substrate via rotation), the occurrence of relative misalignment of the sub-pixels of a pixel is reduced because each sub-pixel of the pixel can be placed in a single placement cycle rather than in separate placement cycles.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A system comprising:
    a carrier stage to hold a semiconductor device carrier;
    a substrate stage to hold a target substrate;
    a pick and place head (PPH) having a plurality of adjoined pick-up surfaces so that a cross-section of the PPH has a polygon shape, each pick-up surface configured to mount or release one or more semiconductor devices;
    one or more micromanipulators mounting the PPH to rotate or move the PPH; and
    a controller configured to control one or more micromanipulators to cause the PPH to:
        rotate along the semiconductor device carrier to pick up arrays of semiconductor devices with the pick-up surfaces; and
        rotate along the target substrate to place the arrays of semiconductor devices from the pick-up surfaces onto the target substrate.

2. The system of claim 1, wherein:
    the target substrate is a display substrate; and
    the semiconductor devices are light emitting diode (LED) dies.

3. The system of claim 1, further comprising a chamber and a scanning electron microscope (SEM), the chamber enclosing the SEM, PPH, carrier stage, and substrate stage, the SEM configured to generate images of the PPH, the target substrate, and the semiconductor device carrier.

4. The system of claim 3, wherein the controller is configured to control the one or more micromanipulators to cause the PPH to:
    align with the semiconductor device carrier based on the images;
    rotate along the semiconductor device carrier subsequent to aligning with the semiconductor device carrier;
    align with the target substrate based on the images; and
    rotate along the target substrate subsequent to aligning with the target substrate.

5. The system of claim 1, wherein the PPH includes a polymeric piezoelectric layer to detect PPH contact with the arrays of semiconductor devices.

6. The system of claim 1, wherein the substrate stage includes a heated surface.

7. The system of claim 1, wherein the substrate stage includes a curved surface to accommodate a curvature of the target substrate.

8. The system of claim 1, wherein the PPH includes:
    a core;
    an inner polymeric protective layer surrounding the core;
    a first electrode layer surrounding the inner polymeric protective layer;
    a polymeric piezoelectric layer surrounding the first electrode layer;
    a second electrode layer surrounding the polymeric piezoelectric layer, the second electrode layer in conjunction with the first electrode layer and the polymeric piezoelectric layer forming a contact sensor for PPH to detect mounting or releasing of the one or more semiconductor devices; and
    an outer polymeric protective layer surrounding the second electrode layer.

9. A pick and place head (PPH), comprising:
    a core including a cross-section having a polygon shape; edge of the polygon shaped cross section defines a pick up surface of the PPH;
    an inner polymeric protective layer surrounding the core;
    a first electrode layer surrounding the inner polymeric protective layer;
    a polymeric piezoelectric layer surrounding the first electrode layer;
    a second electrode layer surrounding the polymeric piezoelectric layer, the second electrode layer in conjunction with the first electrode layer and the polymeric piezoelectric layer forming a contact sensor for PPH to detect mounting or releasing of one or more semiconductor devices; and
    an outer polymeric protective layer surrounding the second electrode layer, the outer polymeric protective layer including a plurality of adjoined pick-up surfaces so that a cross-section of the PPH has the polygon shape.

10. The PPH of claim 9, wherein the core includes metallic or ceramic material.

11. The PPH of claim 9, wherein each pick-up surface of the PPH is configured to mount or release an array of semiconductor devices.

12. The PPH of claim 9, wherein the one or more semiconductor devices are light emitting diode (LED) dies.

* * * * *

UNITED STATES PATENT AND TRADEMARK OFFICE
CERTIFICATE OF CORRECTION

PATENT NO. : 10,714,363 B2
APPLICATION NO. : 15/371039
DATED : July 14, 2020
INVENTOR(S) : Pooya Saketi and Patrick Joseph Hughes It is certified that error appears in the above-identified patent and that said Letters Patent is hereby corrected as shown below:

In the Claims

Column 16, Lines 35-36, Claim 9, delete "edge of the polygon shaped cross section defines a pick up surface of the PPH".

Signed and Sealed this
Twenty-second Day of December, 2020

Andrei Iancu
*Director of the United States Patent and Trademark Office*